US009240483B2

(12) United States Patent
Lee et al.

(10) Patent No.: US 9,240,483 B2
(45) Date of Patent: Jan. 19, 2016

(54) FIN-TYPE FIELD EFFECT TRANSISTORS INCLUDING ALUMINUM DOPED METAL-CONTAINING LAYER

(71) Applicant: Samsung Electronics Co., Ltd., Suwon-si, Gyeonggi-do (KR)

(72) Inventors: June-hee Lee, Hwasung-si (KR); Jae-yeol Song, Seoul (KR); Hye-Ian Lee, Hwasung-si (KR); Hong-bae Park, Seoul (KR); Sang-jin Hyun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 276 days.

(21) Appl. No.: 13/684,655

(22) Filed: Nov. 26, 2012

(65) Prior Publication Data

US 2013/0277748 A1 Oct. 24, 2013

(30) Foreign Application Priority Data

Apr. 20, 2012 (KR) .................. 10-2012-0041598

(51) Int. Cl.
*H01L 21/70* (2006.01)
*H01L 29/78* (2006.01)
*H01L 27/088* (2006.01)

(52) U.S. Cl.
CPC .......... *H01L 29/785* (2013.01); *H01L 27/0886* (2013.01)

(58) Field of Classification Search
USPC .......... 257/368, 347, 369, E21.632, E27.062, 257/E21.623; 438/183, 926
See application file for complete search history.

(56) References Cited

U.S. PATENT DOCUMENTS

| 7,868,395 | B2 | 1/2011 | Watanabe et al. | |
|---|---|---|---|---|
| 2008/0090397 | A1* | 4/2008 | Brask et al. | 438/592 |
| 2009/0032887 | A1 | 2/2009 | Jang et al. | |
| 2009/0134466 | A1 | 5/2009 | Cho et al. | |
| 2009/0170267 | A1* | 7/2009 | Shah et al. | 438/283 |
| 2010/0081262 | A1* | 4/2010 | Lim et al. | 438/479 |
| 2010/0219481 | A1* | 9/2010 | Tseng et al. | 257/369 |
| 2010/0264497 | A1* | 10/2010 | Chang et al. | 257/393 |
| 2011/0140207 | A1* | 6/2011 | Lin et al. | 257/412 |

(Continued)

FOREIGN PATENT DOCUMENTS

KR 10-2010-0037975 A 4/2010

OTHER PUBLICATIONS

"Synthesis of Ternary Titanium Aluminum Carbides Using Self-Propagating High-Temperature Synthesis Technique" by Lopacinski et al., J. Am. Ceram. Soc., 84 [12] 3051-53 (2001).*

(Continued)

*Primary Examiner* — Matthew Gordon
(74) *Attorney, Agent, or Firm* — Myers Bigel Sibley & Sajovec, P.A.

(57) ABSTRACT

A semiconductor device includes a fin-type active region; a gate dielectric layer covering an upper surface and opposite lateral surfaces of the fin-type active region; and a gate line extending on the gate dielectric layer to cover the upper surface and opposite lateral surfaces of the fin-type active region and to cross the fin-type active region. The gate line includes an aluminum (Al) doped metal-containing layer extending to cover the upper surface and opposite lateral surfaces of the fin-type active region to a uniform thickness, and a gap-fill metal layer extending on the Al doped metal-containing layer over the fin-type active region. Related fabrication methods are also described.

20 Claims, 23 Drawing Sheets

(56) References Cited

U.S. PATENT DOCUMENTS

| | | |
|---|---|---|
| 2011/0147831 A1* | 6/2011 | Steigerwald et al. ......... 257/330 |
| 2011/0227170 A1 | 9/2011 | Zhu et al. |
| 2011/0260258 A1 | 10/2011 | Zhu et al. |
| 2011/0263115 A1 | 10/2011 | Ganguli et al. |
| 2013/0026578 A1* | 1/2013 | Tsau ............................ 257/368 |
| 2013/0115383 A1* | 5/2013 | Lu et al. ....................... 427/535 |

OTHER PUBLICATIONS

Thompson et al, "Deposition of Metal Films Using Alane Precursors", U.S. Appl. No. 61/557,119, filed Nov. 8, 2011.

Lu et al., "Deposition of Metal Films Using Alane Based Precursors", U.S. Appl. No. 61/614,922, filed Mar. 23, 2012.

* cited by examiner

FIN-TYPE FIELD EFFECT TRANSISTORS INCLUDING ALUMINUM DOPED METAL-CONTAINING LAYER

CROSS-REFERENCE TO RELATED APPLICATIONS

This application claims priority to Korean Patent Application No. 10-2012-0041598, filed on Apr. 20, 2012, in the Korean Intellectual Property Office, the disclosure of which is incorporated herein in its entirety by reference.

BACKGROUND

The inventive concepts relate to semiconductor devices including transistors, and more particularly, to semiconductor devices including fin-type field effect transistors (FinFET).

As semiconductor devices are becoming more highly integrated, a planar metal oxide semiconductor FET (MOSFET) may be replaced by a FinFET having a channel with a three-dimensional (3D) structure.

SUMMARY

The inventive concepts can provide a semiconductor device whereby stable electrical properties can be obtained in a plurality of fin-type field effect transistors (FinFETs) formed on a single substrate and an electrical property deviation in a plurality of FinFETs formed on a single substrate can be reduced or minimized.

According to aspects of the inventive concepts, there is provided a semiconductor device including a fin-type active region; a gate dielectric layer on an upper surface and opposite lateral surfaces of the fin-type active region; and a gate line extending on the gate dielectric layer on the upper surface and opposite lateral surfaces of the fin-type active region, wherein the gate line includes an aluminum (Al) doped metal-containing layer extending on the upper surface and opposite lateral surfaces of the fin-type active region at a uniform thickness, and a gap-fill metal layer extending on the Al doped metal-containing layer remote from the fin-type active region.

According to other aspects of the inventive concepts, there is provided a semiconductor device including a first metal oxide semiconductor (MOS) transistor and a second MOS transistor. The first MOS transistor includes a first gate line including a first fin-type active region having a first conductive channel region, and a first Al doped metal-containing layer on an upper surface and opposite lateral surfaces of the first fin-type active region. The second MOS transistor includes a second gate line including a second fin-type active region having a second conductive channel region that is different conductivity type from the first conductive channel region, and a metal nitride-containing layer on an upper surface and opposite lateral surfaces of the second fin-type active region and having a greater thickness than a thickness of the first Al doped metal-containing layer.

According to yet other aspects of the inventive concepts, there is provided a semiconductor device comprising a substrate; a fin-type active region that protrudes from the substrate; a gate dielectric layer on the an upper surface and opposite lateral surfaces of the fin-type active region; and a gate line extending on the gate dielectric layer on the upper surface and opposite lateral surfaces of the fin-type active region. The gate line comprises a layer comprising aluminum (Al) and another metal, extending on the upper surface and opposite lateral surfaces of the fin-type active region, and a gap-fill layer extending on the layer comprising Al and another metal, remote from the fin-type active region.

BRIEF DESCRIPTION OF THE DRAWINGS

Various embodiments of the inventive concepts will be more clearly understood from the following detailed description taken in conjunction with the accompanying drawings in which:

FIGS. 7A and 7B through 15A and 15B are cross-sectional views for describing a method of manufacturing a semiconductor device, according to an embodiment of the inventive concepts;

DETAILED DESCRIPTION OF THE EMBODIMENTS

Figure 1A:
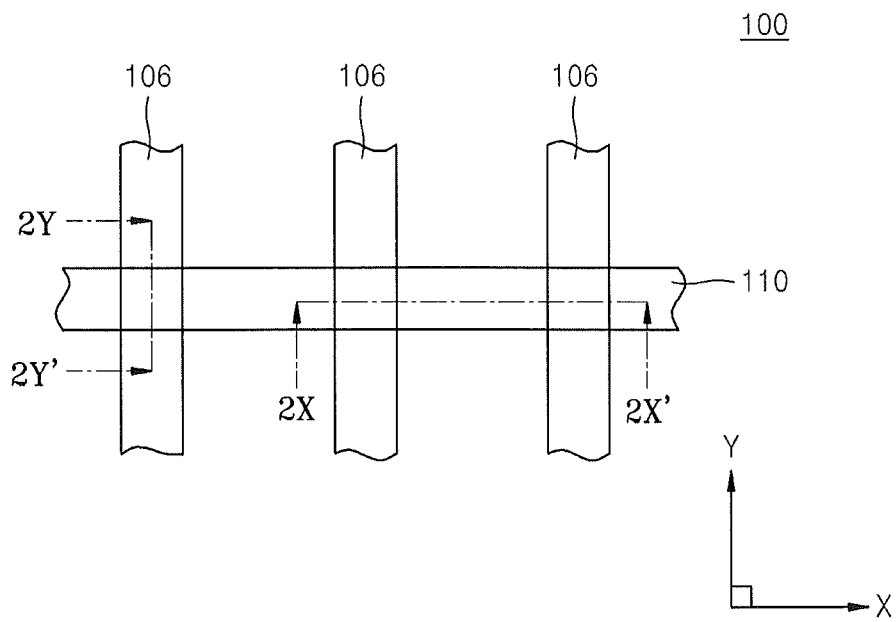
FIG. 1A is a plan view of a semiconductor device according to an embodiment of the inventive concepts.

The inventive concepts will now be described more fully with reference to the accompanying drawings, in which various embodiments of the inventive concepts are shown. In the drawings, the same elements are denoted by the same reference numerals, and a repeated explanation thereof will not be given. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to various embodiments, examples of which are illustrated in the accompanying drawings. However, the various embodiments are not limited to the embodiments illustrated hereinafter, and the embodiments herein are rather introduced to provide easy and complete understanding of the scope and spirit of example embodiments.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the inventive concepts. For example, a first element may be termed a second element and a second element may be termed a first element without departing from the teachings of the inventive concepts.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The steps of all methods described herein may be performed in any suitable order unless otherwise indicated herein or otherwise clearly contradicted by context. For example, two processes that are continuously described may be materially simultaneously performed or may be performed in an opposite order to the described order.

As such, variations from the shapes of the illustrations as a result, for example, of manufacturing techniques and/or tolerances, are to be expected. Thus, embodiments of the inventive concepts should not be construed as limited to the particular shapes of regions illustrated herein but are to include deviations in shapes that result, for example, from manufacturing.

Figure 1B:
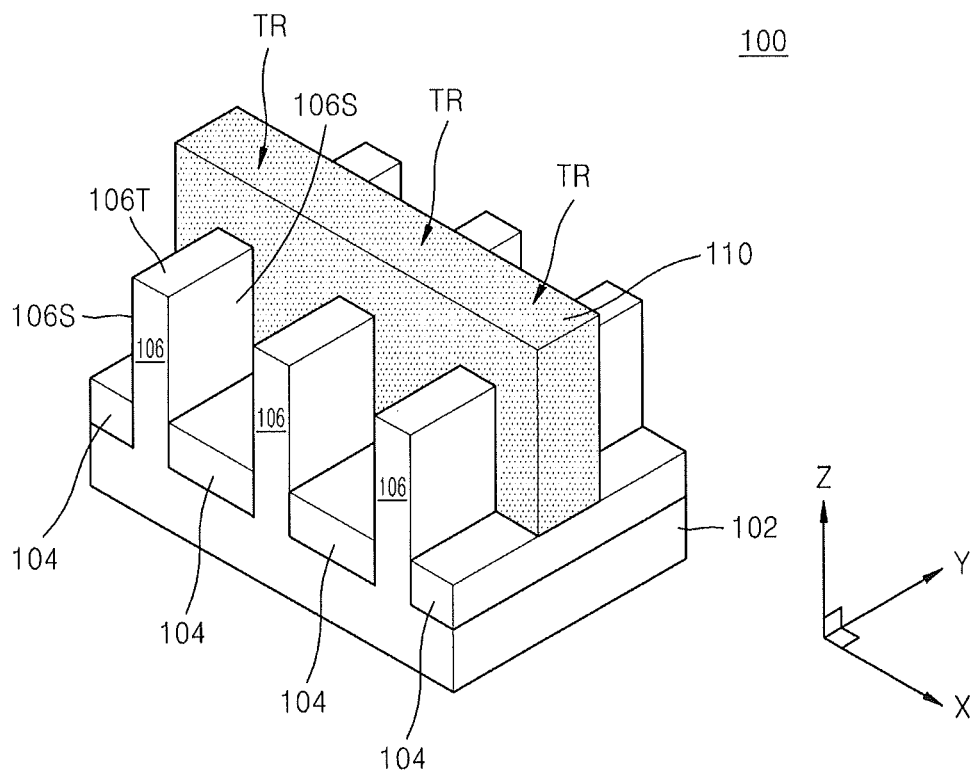
FIG. 1B is a perspective view of the semiconductor device of FIG. 1A, according to an embodiment of the inventive concepts.

FIG. 1A is a plan view of a semiconductor device 100 according to an embodiment of the inventive concepts. FIG. 1B is a perspective view of the semiconductor device 100 of FIG. 1A, according to an embodiment of the inventive concepts.

Referring to FIGS. 1A and 1B, the semiconductor device 100 includes a plurality of fin-type active regions 106 that protrude from a substrate 102. According to the present embodiment, the plurality of fin-type active regions 106 are formed but the inventive concepts are not limited thereto. According to another embodiment of the inventive concepts, only a single fin-type active region 106 may be formed on the substrate 102.

The substrate 102 may include silicon (Si), for example, crystalline Si, polycrystalline Si, or amorphous Si. In other some embodiments of the inventive concepts, the substrate 102 may include germanium (Ge) or a compound semiconductor such as silicon germanium (SiGe), silicon carbide (SiC), gallium arsenide (GaAs), indium arsenide (InAs), and/or indium phosphide (InP). In at least one embodiment of the inventive concepts, the substrate 102 may have a silicon or semiconductor on insulator (SOI) structure. For example, the substrate 102 may include a buried oxide layer (BOX). In some embodiments of the inventive concepts, the substrate 102 may include a conductive region, for example, a well doped with impurities or a structure doped with impurities.

The active regions 106 extend in parallel to each other in one direction (a Y direction of FIGS. 1A and 1B). Isolation layers 104 are formed on the substrate 102 between the active regions 106. The active regions 106 protrude to have a fin shape over the isolation layers 104.

A gate structure 110 extends on the isolation layers 104 formed on the substrate 102 in one direction (an X direction of FIGS. 1A and 1B) so as to extend on, and in some embodiments to cover, upper surfaces and lateral surfaces of the active regions 106, and in some embodiments to cross the active regions 106. A plurality of metal oxide semiconductor (MOS) transistors (TRs) are formed along the gate structure 110. Each of the MOS transistors TRs includes a MOS transistor with a three-dimensional (3D) structure in which channels are formed in upper surfaces 106T and opposite lateral surfaces 106S of the active regions 106.

Figure 2:
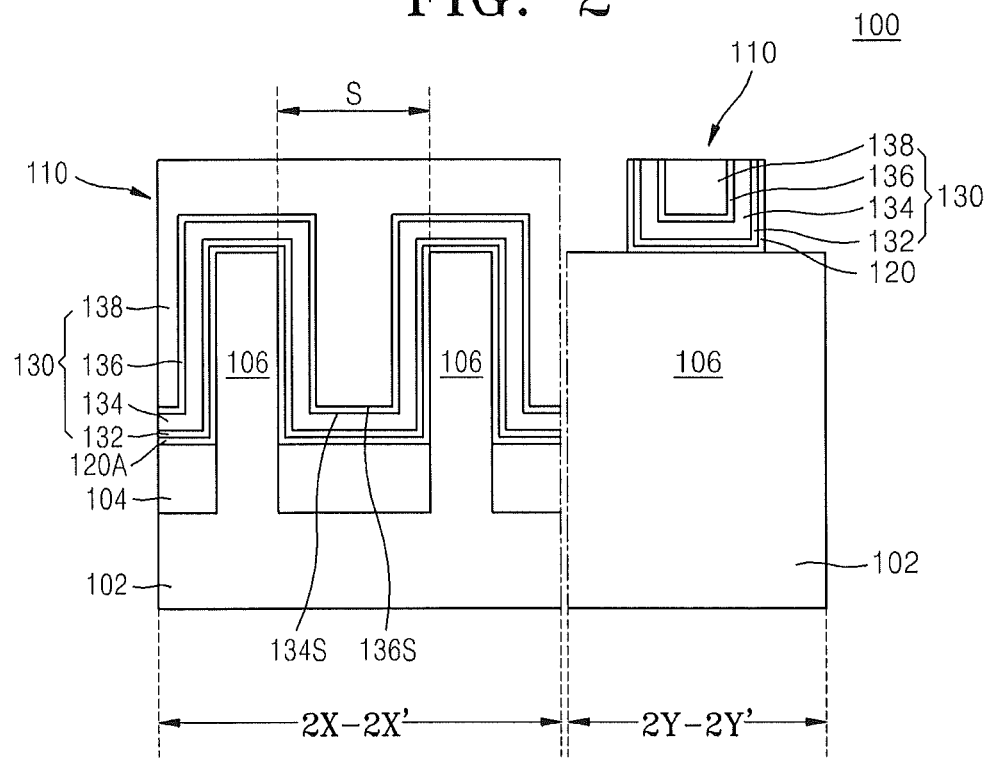
FIG. 2 is a cross-sectional view of the semiconductor device taken along a line 2X-2X' and a line 2Y-2Y' of FIG. 1A, according to an embodiment of the inventive concepts.

FIG. 2 is a cross-sectional view of the semiconductor device 100 taken along a line 2X-2X' and a line 2Y-2Y' of FIG. 1A, according to an embodiment of the inventive concepts.

Referring to FIG. 2, the gate structure 110 includes a gate dielectric layer 120 that is on, and in some embodiments covers, upper surfaces 106T and opposite lateral surfaces 106S of the active regions 106, and a gate line 130 that extends on, and in some embodiments covers, the upper surfaces 106T and the opposite lateral surfaces 106S of the active regions 106, and in some embodiments to cross the active regions 106 on the gate dielectric layer 120.

The gate dielectric layer 120 may be formed of a high dielectric film having a dielectric constant higher than that of a silicon oxide layer. For example, the gate dielectric layer 120 may have a dielectric constant of about 10 to about 25. In some embodiments of the inventive concepts, the gate dielectric layer 120 may comprise hafnium dioxide (HfO), hafnium silicon oxide (HfSiO), hafnium oxynitride (HfON), hafnium silicon oxynitride (HfSiON), lanthanum oxide (LaO), hafnium aluminum oxide (LaAlO), zirconium oxide (ZrO), zirconium silicon oxide (ZrSiO), zirconium oxynitride (ZrON), zirconium oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and/or lead scandium tantalum oxide (PbScTaO). In some embodiments of the inventive concepts, the gate dielectric layer 120 is formed via an atomic layer deposition (ALD) process.

The gate line 130 covers the upper surfaces 106T and the opposite lateral surfaces 106S of the active regions 106 on the gate dielectric layer 120 and extends to cross the active regions 106.

The gate line 130 includes a metal nitride-containing layer 132, an Al doped metal-containing layer 134, a conductive capping layer 136, and a gap-fill metal layer 138, which are sequentially stacked on the gate dielectric layer 120.

The metal nitride-containing layer 132 may be formed of nitride of at least one metal comprising titanium (Ti), tantalum (Ta), tungsten (W), ruthenium (Ru), niobium (Nb), molybdenum (Mo), and/or hafnium (Hf). In some embodiments of the inventive concepts, the metal nitride-containing layer 132 includes a Ti nitride layer including Ti and N, wherein the atomic % amount of N is greater than the atomic % amount of Ti. In some embodiments of the inventive concepts, the metal nitride-containing layer 132 may further include an oxygen (O) component. The atomic % amount of the oxygen (O) component of the metal nitride-containing layer 132 may be smaller than the atomic % amount of Ti and may be smaller than the atomic % amount of N. In some embodiments of the inventive concepts, the metal nitride-containing layer 132 may be formed via an ALD process, a metal organic atomic layer deposition (MOALD) process, and/or a metal organic chemical vapor deposition (MOCVD) process.

The metal nitride-containing layer 132 serves as a barrier that reduces or prevents metal elements contained in a metal-containing layer formed above the metal nitride-containing layer 132 from being diffused into the gate dielectric layer 120. For example, the metal nitride-containing layer 132 serves as a barrier that prevents aluminum (Al) elements contained in the Al doped metal-containing layer 134 described below from being diffused into the gate dielectric layer 120.

The Al doped metal-containing layer 134 extends to a uniform thickness on, and in some embodiments to cover, the upper surfaces 106T and the opposite lateral surfaces 106S of the active regions 106 on the gate dielectric layer 120 and the metal nitride-containing layer 132. A step difference portion 134S for defining a recess space on the Al doped metal-containing layer 134 is formed on an upper surface of the Al doped metal-containing layer 134 in a space S between the active regions 106. In some embodiments of the inventive concepts, the Al doped metal-containing layer 134 is formed via an ALD process.

In some embodiments of the inventive concepts, the Al doped metal-containing layer 134 includes Ta and/or Ti. In some embodiments of the inventive concepts, the Al doped metal-containing layer 134 includes an $M_xAl_yC_z$ layer, wherein M is Ta or Ti, x, y, and z are each atomic %, $5 \leq x \leq 45$, $10 \leq y \leq 65$, $0 \leq z \leq 45$, and $x+y+z \leq 100$. In this case, $x<y$. That is, the amount of Al is greater than the amount of M (Ta or Ti) in the Al doped metal-containing layer 134.

In other embodiments of the inventive concepts, the Al doped metal-containing layer 134 includes a $M_xAl_yC_z$ layer, wherein M is Ta or Ti, x, y, and z are each atomic %, $5 \leq x \leq 45$, $10 \leq y \leq 65$, $0 \leq z \leq 45$, and $x+y+z \leq 100$, and $0.3<(y/x) \leq 10$.

In yet other embodiments of the inventive concepts, the layer 134 is a layer comprising aluminum (Al) and another metal. The other metal may comprise Ta and/or Ti. In some of these embodiments, the layer comprising Al and another metal comprises an $M_xAl_yC_z$ layer, wherein M is the other metal, x, y, and z are each atomic %, $5 \leq x \leq 45$, $10 \leq y \leq 65$, $0 \leq z \leq 45$, and $x+y+z \leq 100$, and wherein $x<y$. In still other embodiments, the layer comprising Al and another metal layer comprises an $M_xAl_yC_z$ layer, wherein M is the other metal, x, y, and z are each atomic %, $5 \leq x \leq 45$, $10 \leq y \leq 65$, $0 \leq z \leq 45$, and $x+y+z \leq 100$, and wherein $0.3<(y/x) \leq 10$.

In still other embodiments of the inventive concepts, the layer 134 does not include any carbon component. In order to obtain the layer 134 having this composition, an inorganic source that does not include any carbon-containing group may be used as a metal source and an Al source during an ALD process for forming the layer 134.

For example, the layer 134 may include Ta of about 5 to about 45 atomic %, Al of about 10 to about 65 atomic %, and carbon (C) of about 0 to about 45 atomic %.

In some embodiments of the inventive concepts, the layer 134 may further include an oxygen (O) component of about 10 to about 65 atomic %. In some embodiments of the inventive concepts, the layer 134 may further include chlorine (Cl) of about 1 to about 3 atomic %. However, according to the inventive concepts, components included in the layer 134 and amounts of the components are not limited to the above-described examples.

The conductive capping layer 136 serves a protective layer that reduces or prevents a surface of the Al doped metal-containing layer 134 from being oxidized. In addition, the conductive capping layer 136 may serve as a wetting layer to facilitate forming another metal layer on the Al doped metal-containing layer 134 via a depositing process. In some embodiments of the inventive concepts, the conductive capping layer 136 includes metal nitride. For example, the conductive capping layer 136 may include TiN, TaN, or a combination thereof, which is obtained from an ALD process. A step difference portion 136S for defining a recess space on the conductive capping layer 136 is formed on an upper surface of the conductive capping layer 136 in the space S between the active regions 106. In some embodiments of the inventive concepts, the conductive capping layer 136 may be omitted.

The gap-fill metal layer 138 fills and covers the space S between the active regions 106 and extends over the conductive capping layer 136. If the conductive capping layer 136 is omitted, the gap-fill metal layer 138 may be formed directly on the Al doped metal-containing layer 134. The gap-fill metal layer 138 may be formed of metal having excellent gap-fill properties. In some embodiments of the inventive concepts, the gap-fill metal layer 138 includes a W layer. The gap-fill metal layer 138 may be formed via an ALD process, a CVD process and/or a physical vapor deposition (PVD) process. The gap-fill metal layer 138 may fill, and in some embodiments may cover, a recess space that is formed on the step difference portion 136S of the conductive capping layer 136 in the space S without any void.

In some embodiments of the inventive concepts, a MOS transistor (TR) of the semiconductor device 100 shown in FIGS. 1A, 1B, and 2 includes an N-channel metal oxide semiconductor (NMOS) transistor. A work function of the NMOS transistor may be determined according to the Al doped metal-containing layer 134. For example, the Al doped metal-containing layer 134 may have a work function of about 4.1 to about 4.5 eV.

Figure 3:
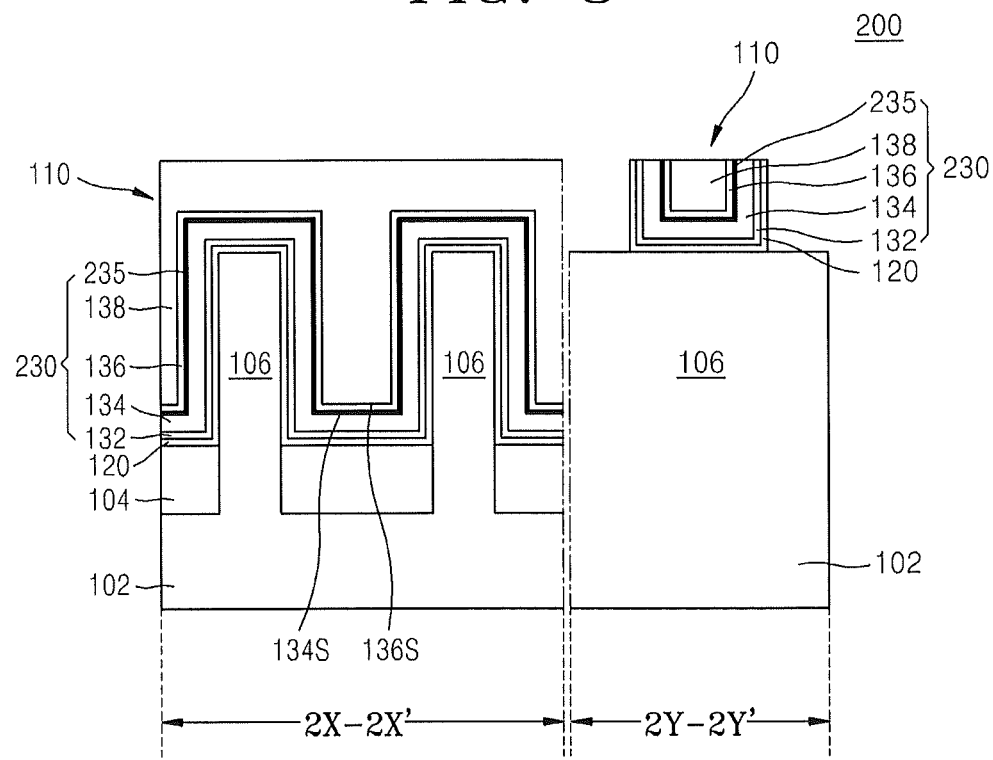
FIG. 3 is a cross-sectional view of a semiconductor device according to another embodiment of the inventive concepts.

FIG. 3 is a cross-sectional view of a semiconductor device 200 according to another embodiment of the inventive concepts. The semiconductor device 200 of FIG. 3 is obtained by modifying the semiconductor device 100 of FIG. 2. Like FIG. 2, FIG. 3 is a cross-sectional view of the semiconductor device 200 taken along lines corresponding to the lines 2X-2X' and 2Y-2Y' of FIG. 1A. In FIGS. 1A, 1B, 2, and 3, the same elements are denoted by the same reference numerals, and a repeated explanation thereof will not be given for simplification of description.

Referring to FIG. 3, a gate line 230 of the semiconductor device 200 further includes a metal oxide layer 235 that is on, and in some embodiments covers, the Al doped metal-containing layer 134 between the Al doped metal-containing layer 134 and the conductive capping layer 136.

When the conductive capping layer 136 is omitted, the metal oxide layer 235 is formed on, and in some embodiments covers, the Al doped metal-containing layer 134 between the Al doped metal-containing layer 134 and the gap-fill metal layer 138.

The metal oxide layer 235 may include at least one layer of a TaO layer, a TiO layer and an AlO layer. In some embodiments of the inventive concepts, the metal oxide layer 235 may have a thickness of about 5 to about 25 Å.

The gate line 230 is almost the same as the gate line 130 described with reference to FIGS. 1A through 2, except that the gate line 230 further includes the metal oxide layer 235.

Figure 4A:
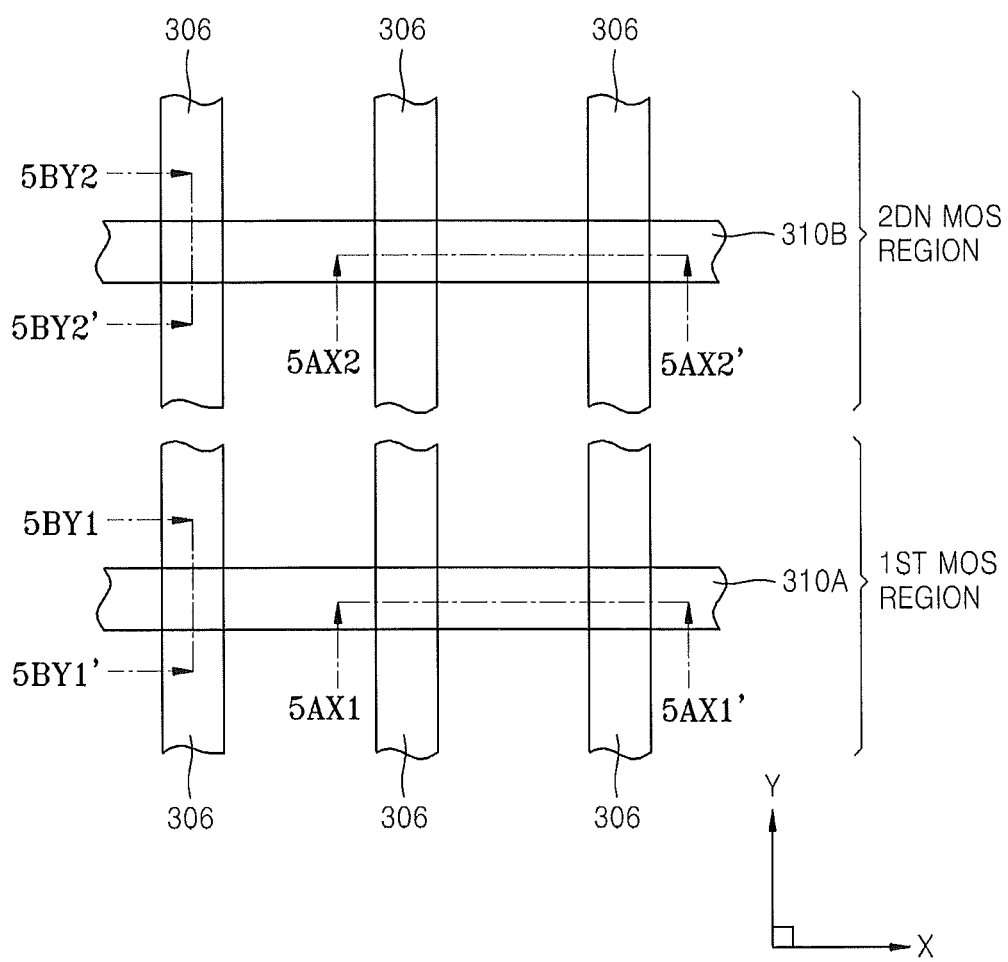
FIG. 4A is a plan view of a semiconductor device according to another embodiment of the inventive concepts.
Figure 4B:
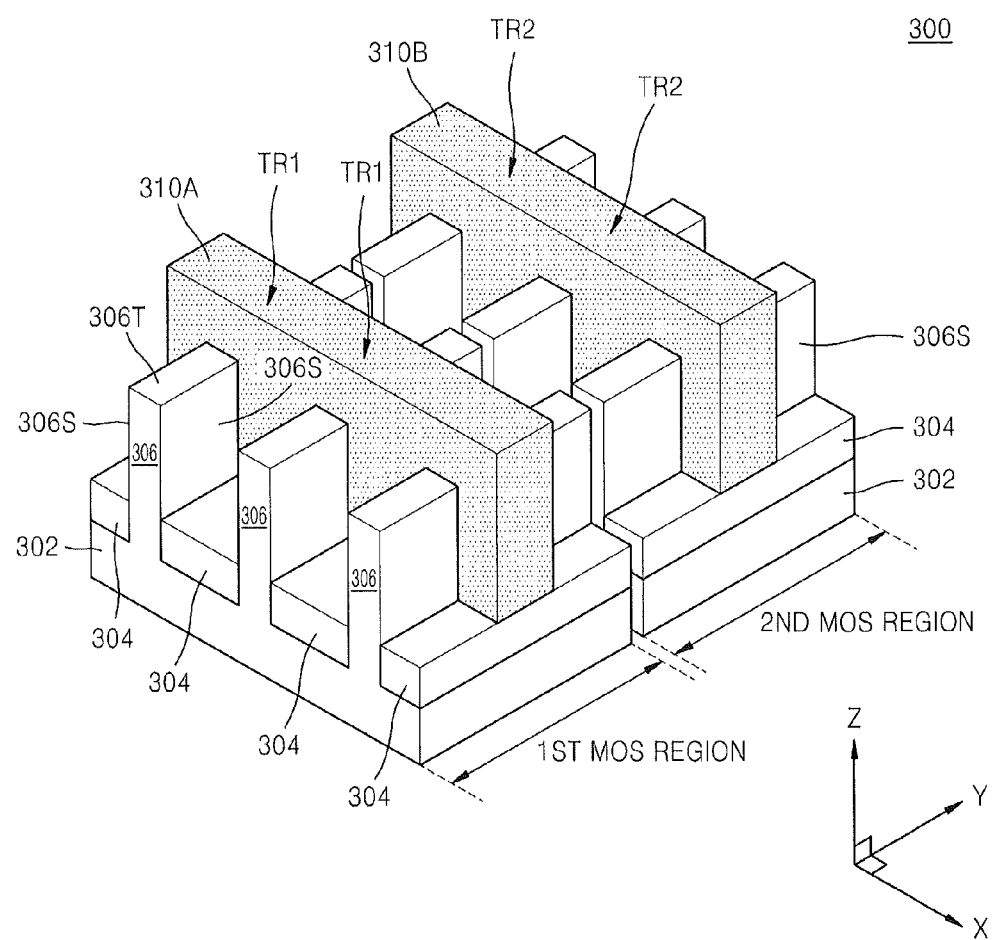
FIG. 4B is a perspective view of the semiconductor device of FIG. 4A, according to another embodiment of the inventive concepts.

FIG. 4A is a plan view of a semiconductor device 300 according to another embodiment of the inventive concepts. FIG. 4B is a perspective view of the semiconductor device 300 of FIG. 4A, according to another embodiment of the inventive concepts. In FIGS. 1A through 4B, the same elements are denoted by the same reference numerals, and a repeated explanation thereof will not be given for simplification of description.

Referring to FIGS. 4A and 4B, the semiconductor device 300 includes a plurality of fin-type active regions 306 that protrude from a substrate 302.

The substrate 302 includes a first MOS region 1ST MOS REGION and a second MOS region 2ND MOS REGION. The fin-type active regions 306 are formed on each of the first MOS region 1ST MOS REGION and the second MOS region 2ND MOS REGION.

The fin-type active regions 306 extend parallel to each other in one direction (a Y direction of FIGS. 1A and 1B) in each of the first MOS region 1ST MOS REGION and the second MOS region 2ND MOS REGION. Isolation layers 304 are formed on the substrate 302 between the fin-type active regions 306. The fin-type active regions 306 protrude to have a fin shape over the isolation layers 304.

In some embodiments of the inventive concepts, the fin-type active regions 306 may extend from the first MOS region 1ST MOS REGION to the second MOS region 2ND MOS REGION so as to be integrated with each other. In some other embodiments of the inventive concepts, in the first MOS region 1ST MOS REGION and the second MOS region 2ND MOS REGION, the fin-type active regions 306 may be separated from each other to have separate structures. FIGS. 4A and 4B show a case where the fin-type active regions 306 extend in the same direction (an X direction of FIGS. 4A and 4B) in the first MOS region 1ST MOS REGION and the second MOS region 2ND MOS REGION. However, the inventive concepts are not limited thereto. The fin-type active regions 306 may extend in different directions in the first MOS region 1ST MOS REGION and the second MOS region 2ND MOS REGION.

In the first MOS region 1ST MOS REGION and the second MOS region 2ND MOS REGION, on the substrate 302, a first gate structure 310A and a second gate structure 310B extend on the isolation layers 304 in one direction (the X direction of FIGS. 4A and 4B) so as to extend on, and in some embodiments to cover, upper surfaces and lateral surfaces of the fin-type active regions 306 and to cross the fin-type active regions 306. In the first MOS region 1ST MOS REGION, a plurality of first MOS transistors TR1s are formed along the first gate structure 310A. In the second MOS region 2ND MOS REGION, a plurality of second MOS transistors TR2s are formed along the second gate structure 310B.

Each of the first MOS transistors TR1s and the second MOS transistors TR2s includes a MOS transistor with a 3D structure in which channels are formed in upper surfaces 306T and opposite lateral surfaces 306S of the fin-type active regions 306.

Figure 5A:
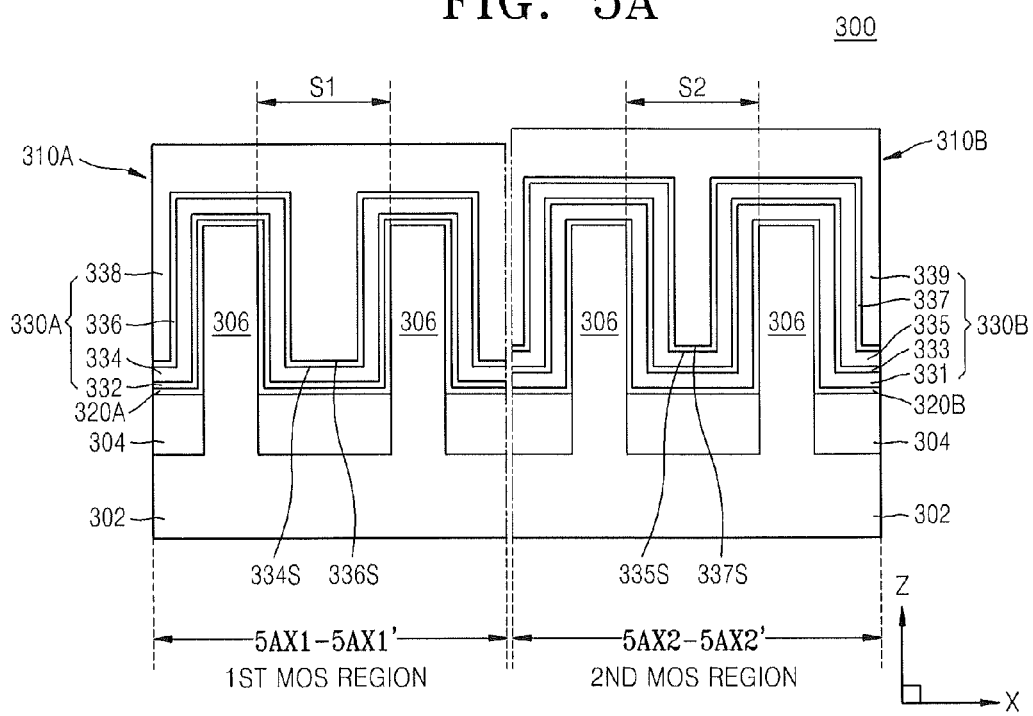
FIG. 5A is a cross-sectional view of the semiconductor device taken along a line 5AX1-5AX1' and a line 5AX2-5AX2' of FIG. 4A, according to an embodiment of the inventive concepts.
Figure 5B:
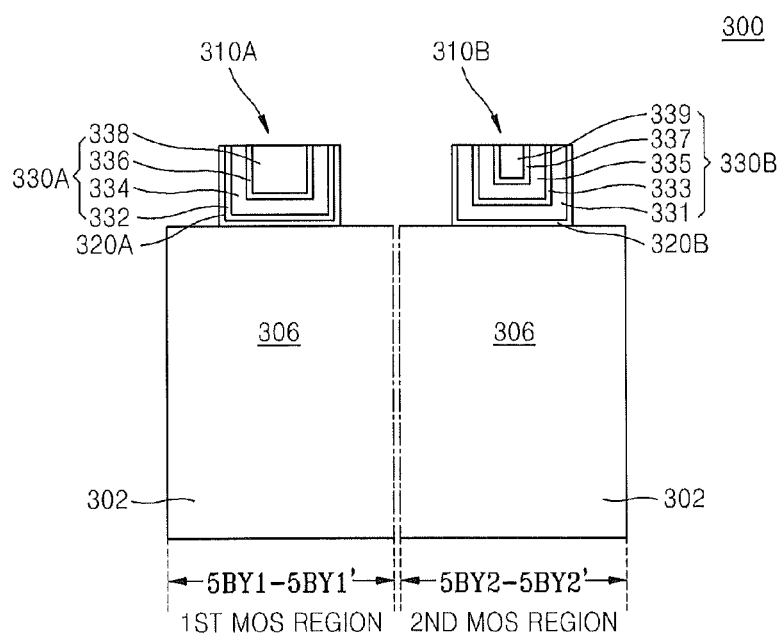
FIG. 5B is a cross-sectional view of the semiconductor device taken along a line 5BY1-5BY1' and a line 5BY2-5BY2' of FIG. 4A, according to an embodiment of the inventive concepts.

FIG. 5A is a cross-sectional view of the semiconductor device 300 taken along a line 5AX1-5AX1' and a line 5AX2-5AX2' of FIG. 4A, according to an embodiment of the inventive concepts. FIG. 5B is a cross-sectional view of the semiconductor device 300 taken along a line 5BY1-5BY1' and a line 5BY2-5BY2' of FIG. 4A, according to an embodiment of the inventive concepts.

Referring to FIGS. 5A and 5B, the first gate structure 310A formed in the first MOS region 1ST MOS REGION includes a first gate dielectric layer 320A that is on, and in some embodiments covers, upper surfaces and opposite lateral surfaces of the fin-type active regions 306, and a first gate line 330A that extends on, and in some embodiments covers, the upper surfaces and the opposite lateral surfaces of the fin-type active regions 306 and to cross the fin-type active regions 306 on the first gate dielectric layer 320A.

The detailed description of the first gate dielectric layer 320A may refer to the detailed description of the gate dielectric layer 120 described with reference to FIG. 2.

The first gate line 330A extends on, and in some embodiments covers, the upper surfaces and the opposite lateral surfaces of the fin-type active regions 306 and to cross the fin-type active regions 306 on the first gate dielectric layer 320A.

The first gate line 330A includes a metal nitride-containing layer 332, an Al doped metal-containing layer 334, a conductive capping layer 336, and a gap-fill metal layer 338, which are sequentially stacked on the first gate dielectric layer 320A.

The metal nitride-containing layer 332 may include a Ti nitride layer including Ti and N, wherein the atomic % amount of N is greater than the atomic % amount of Ti.

In some embodiments of the present invention, the Al doped metal-containing layer 334 may include Ta and/or Ti. In some embodiments of the present invention, the atomic % amount of Al is greater than the atomic % amount of the first metal in the Al doped metal-containing layer 334.

A step difference 334S for defining a recess space on the Al doped metal-containing layer 334 is formed on an upper surface of the Al doped metal-containing layer 334 in a first space S1 between the fin-type active regions 306. In some embodiments of the inventive concepts, the Al doped metal-containing layer 134 is formed via an ALD process.

The conductive capping layer 336 may be formed of TiN, TaN, or a combination thereof.

A step difference 336S for defining a recess space on the conductive capping layer 336 is formed on an upper surface of the conductive capping layer 336 in the first space S1 between the fin-type active regions 306. In some embodiments of the present inventive concepts, the conductive capping layer 136 is formed via an ALD process. In some other embodiments of the inventive concepts, the conductive capping layer 336 may be omitted.

The gap-fill metal layer 338 extends over the conductive capping layer 336 to fill, and in some embodiments to cover, the first space S1 between the fin-type active regions 306. When the conductive capping layer 336 is omitted, the gap-fill metal layer 338 may be formed directly on the Al doped metal-containing layer 334. The gap-fill metal layer 338 may be formed of metal having excellent gap-fill properties. In some embodiments of the inventive concepts, the gap-fill metal layer 338 includes W and/or TiN. The gap-fill metal layer 338 may be formed via an ALD, CVD and/or PVD process. The gap-fill metal layer 338 may fill, and in some embodiments may cover, a recess space that is formed on the step difference 336S of the conductive capping layer 336 in the first space S1 without forming any void.

The detailed structures of the metal nitride-containing layer 332, the Al doped metal-containing layer 334, the conductive capping layer 336, and the gap-fill metal layer 338 are the same as those of the metal nitride-containing layer 132, the Al doped metal-containing layer 134, the conductive capping layer 136, and the gap-fill metal layer 138, which have already been described with reference to FIG. 2.

In some embodiments of the inventive concepts, a plurality of NMOS transistors are formed by the first gate structure 310A formed on the fin-type active regions 306 in the first MOS region 1ST MOS REGION of the substrate 302. A work function of the NMOS transistors may be determined according to the Al doped metal-containing layer 334. For example, the Al doped metal-containing layer 334 may have a work function of about 4.1 to about 4.5 eV.

Referring to FIGS. 5A and 5B, the second gate structure 310B formed in the second MOS region 2ND MOS REGION includes a second gate dielectric layer 320B that is on, and in some embodiments covers, upper surfaces and opposite lateral surfaces of the fin-type active regions 306, and a second gate line 330B that extends on, and in some embodiments covers, the upper surfaces and the opposite lateral surfaces of the fin-type active regions 306 and to cross the fin-type active regions 306 on the second gate dielectric layer 320B.

The detailed description of the second gate dielectric layer 320B may refer to the detailed description of the gate dielectric layer 120 described with reference to FIG. 2.

The second gate line 330B includes a first metal nitride-containing layer 331, a second metal nitride-containing layer 333, an Al doped metal-containing layer 335, a conductive capping layer 337, and a gap-fill metal layer 339, which are sequentially stacked on the second gate dielectric layer 320B.

In some embodiments of the inventive concepts, the first metal nitride-containing layer 331 and the second metal nitride-containing layer 333 have different thicknesses. As shown in FIGS. 5A and 5B, the first metal nitride-containing layer 331 may have a greater thickness than that of the second metal nitride-containing layer 333. For example, the first metal nitride-containing layer 331 may have a thickness of about 50 Å and the second metal nitride-containing layer 333 may have a thickness of about 10 Å. However, the inventive concepts are not limited thereto. If necessary, the first metal nitride-containing layer 331 may have a smaller thickness than that of the second metal nitride-containing layer 333.

In some embodiments of the inventive concepts, the amount of N contained in the first metal nitride-containing layer 331 is equal to or greater than the amount of N contained in the second metal nitride-containing layer 333. However, the inventive concepts are not limited thereto. If necessary, the amount of N contained in the first metal nitride-containing layer 331 and the amount of N contained in the second metal nitride-containing layer 333 may be the same.

In some embodiments of the inventive concepts, the first metal nitride-containing layer 331 and the second metal nitride-containing layer 333 are each formed of nitride of at least one metal comprising Ti, Ta, W, Ru, Nb, Mo and/or Hf. In some embodiments of the inventive concepts, the first metal nitride-containing layer 331 and the second metal nitride-containing layer 333 may each include a Ti nitride layer including Ti and N, wherein the amount of N is greater than the amount of Ti. In some embodiments of the inventive concepts, the first metal nitride-containing layer 331 and the second metal nitride-containing layer 333 may each further include an oxygen (O) component. The atomic % amount of the oxygen (O) component of the first metal nitride-containing layer 331 and the second metal nitride-containing layer 333 may be smaller than the atomic % amount of Ti and may be smaller than the atomic % amount of N. In some embodiments of the inventive concepts, the first metal nitride-containing layer 331 and the second metal nitride-containing layer 333 are formed via an ALD, MOALD and/or MOCVD process. The first metal nitride-containing layer 331 and the second metal nitride-containing layer 333 may be formed by using the same source. Alternatively, the first metal nitride-containing layer 331 and the second metal nitride-containing layer 333 may be formed by using different sources.

In some embodiments of the inventive concepts, the second metal nitride-containing layer 333 formed in the second MOS region 2ND MOS REGION has the same composition and thickness as those of the metal nitride-containing layer 332 formed in the first MOS region 1ST MOS REGION.

In some embodiments of the inventive concepts, a plurality of P-channel metal oxide semiconductor (PMOS) transistors are formed by the second gate structure 310B formed on the fin-type active regions 306 in the second MOS region 2ND MOS REGION of the substrate 302. A work function of the PMOS transistors may be determined according to the first metal nitride-containing layer 331 and the second metal nitride-containing layer 333. For example, the first metal nitride-containing layer 331 and the second metal nitride-containing layer 333 may have a work function of about 4.8 to about 5.2 eV.

The first metal nitride-containing layer 331 and the second metal nitride-containing layer 333 serve as a barrier that reduces or prevents metal elements contained in a metal-containing layer formed above the first metal nitride-containing layer 331 and the second metal nitride-containing layer 333 from being diffused into the second gate dielectric layer 320B. For example, the first metal nitride-containing layer 331 and the second metal nitride-containing layer 333 serve as a barrier that reduces or prevents aluminum (Al) elements contained in the Al doped metal-containing layer 335 formed on the first metal nitride-containing layer 331 and the second metal nitride-containing layer 333 from being diffused into the second gate dielectric layer 320B.

The Al doped metal-containing layer 335 extends with a uniform thickness to cover upper surfaces and opposite lateral surfaces of the fin-type active regions 306 on the second metal nitride-containing layer 333.

A step difference portion 335S for defining a recess space on the Al doped metal-containing layer 335 is formed on an upper surface of the Al doped metal-containing layer 335 in a second space S2 between the fin-type active regions 306. In some embodiments of the inventive concepts, the Al doped metal-containing layer 335 is formed via an ALD process.

The Al doped metal-containing layer 335 formed in the second MOS region 2ND MOS REGION has the same composition and thickness as those of the Al doped metal-containing layer 334 formed in the first MOS region 1ST MOS REGION.

In the second gate structure 310B, the sum of the thickness of the first metal nitride-containing layer 331 and the thickness of the second metal nitride-containing layer 333 is greater than the thickness of the Al doped metal-containing layer 335. When a PMOS transistor is formed by the second gate structure 310B in the second MOS region 2ND MOS REGION, the first metal nitride-containing layer 331 and the second metal nitride-containing layer 333 may be thick enough that a work function of the PMOS transistor may be determined according to the first metal nitride-containing layer 331 and the second metal nitride-containing layer 333. In addition, a work function of a PMOS transistor formed in the second MOS region 2ND MOS REGION may be nearly completely unaffected by the Al doped metal-containing layer 335.

The detailed structure of the Al doped metal-containing layer 335 is the same as that of the Al doped metal-containing layer 134 described above with reference to FIG. 2.

The conductive capping layer 337 may include TiN, TaN, or a combination thereof.

A step difference 337S for defining a recess space on the conductive capping layer 337 is formed on an upper surface of the conductive capping layer 337 in the second space S2 between the fin-type active regions 306. The conductive capping layer 337 formed in the second MOS region 2ND MOS REGION may have the same composition and thickness as those of the conductive capping layer 336 formed in the first MOS region 1ST MOS REGION. In some embodiments of the inventive concepts, the conductive capping layer 337 may be formed via an ALD process. The detailed description of the conductive capping layer 337 may refer to the detailed description of the conductive capping layer 136 described with reference to FIG. 2. In some embodiments of the inventive concepts, the conductive capping layer 337 may be omitted.

The gap-fill metal layer 339 extends over the conductive capping layer 337 to fill, and in some embodiments to cover, the second space S2 between the fin-type active regions 306. When the conductive capping layer 337 is omitted, the gap-fill metal layer 339 may be formed directly on the Al doped metal-containing layer 335. The gap-fill metal layer 339 formed in the second MOS region 2ND MOS REGION may have the same composition as that of the gap-fill metal layer 338 formed in the first MOS region 1ST MOS REGION. In some embodiments of the inventive concepts, the gap-fill metal layer 339 may include W and/or TiN. The gap-fill metal layer 339 may be formed via an ALD, CVD or PVD process. The gap-fill metal layer 339 may fill, and in some embodiments may cover, a recess space that is formed on the step difference 337S of the conductive capping layer 337 in the second space S2 without any void. The detailed description of the gap-fill metal layer 339 may refer to the detailed description of the gap-fill metal layer 138 described with reference to FIG. 2.

Figure 6A:
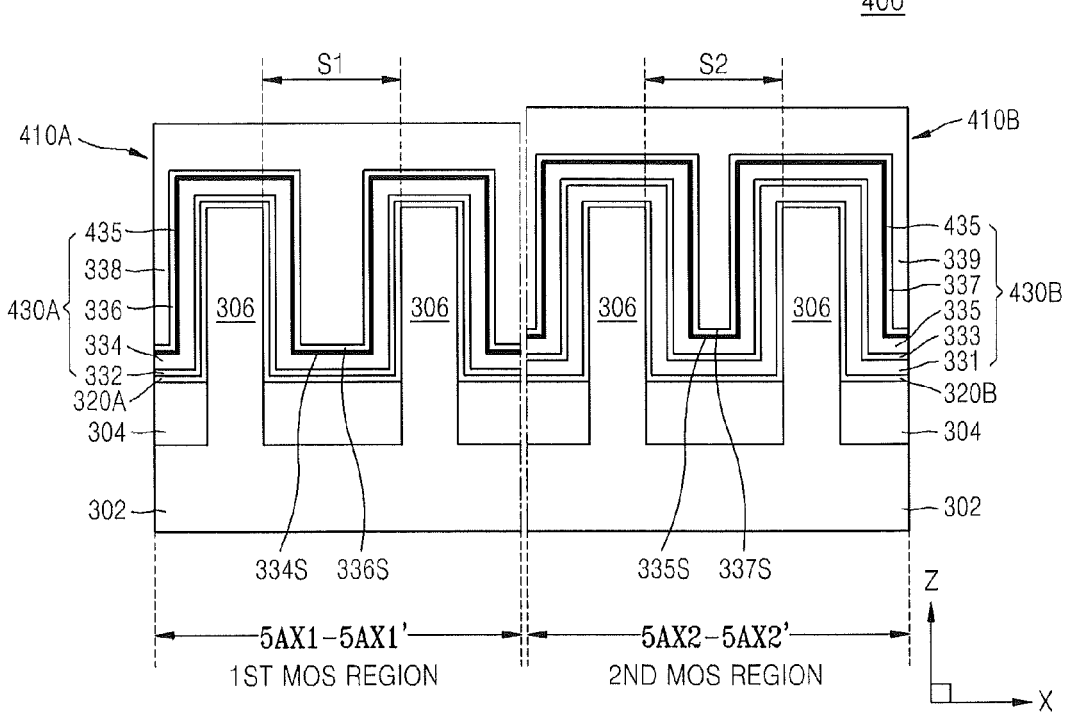
FIGS. 6A and 6B are cross-sectional views of a semiconductor device according to another embodiment of the inventive concepts.
Figure 6B:
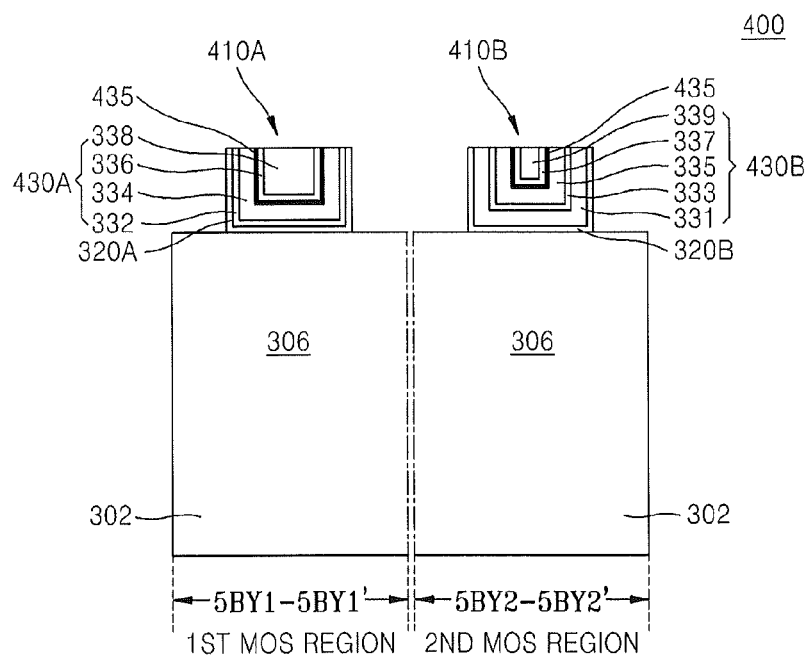

FIGS. 6A and 6B are cross-sectional views of a semiconductor device 400 according to another embodiment of the inventive concepts. The semiconductor device 400 shown in FIGS. 6A and 6B is a modified embodiment of the semiconductor device 300 shown in FIGS. 4A through 5B. Like FIGS. 5A and 5B, FIG. 6A is a cross-sectional view of the semiconductor device 400 taken along lines corresponding to the lines 5AX1-5AX1' and 5AX2-5AX2' of FIG. 4A. In addition, FIG. 6B is a cross-sectional view of the semiconductor device 400 taken along lines corresponding to the lines 5BY1-5BY1' and 5BY2-5BY2' of FIG. 4A. In FIGS. 4A through 6B, the same elements are denoted by the same reference numerals, and a repeated explanation thereof will not be given for simplification of description.

Referring to FIGS. 6A and 6B, the semiconductor device 400 includes a first gate structure 410A formed in the first MOS region 1ST MOS REGION and a second gate structure 410B formed in the second MOS region 2ND MOS REGION. The first gate structure 410A includes a first gate line 430A. The second gate structure 410B includes a second gate line 430B.

The first gate line 430A and the second gate line 430B may include metal oxide layers 435 that respectively are on, and in some embodiments cover, the Al doped metal-containing layers 334 and 335 between the Al doped metal-containing layers 334 and 335 and the conductive capping layers 336 and 337, respectively.

When the conductive capping layers 336 and 337 are omitted, the metal oxide layers 435 may be formed on, and in some embodiments cover, the Al doped metal-containing layers 334 and 335 between the Al doped metal-containing layers 334 and 335 and the gap-fill metal layers 338 and 339, respectively.

The metal oxide layers 435 may include at least one layer of a TaO layer, a TiO layer and an AlO layer. In some embodiments of the inventive concepts, the metal oxide layers 435 have a thickness of about 5 to about 25 Å.

The first gate line 430A and the second gate line 430B are almost the same as the first gate line 330A and the second gate line 330B described with reference to FIGS. 4A through 5B, except that the first gate line 430A and the second gate line 430B further include the metal oxide layers 435, respectively.

FIGS. 7A and 7B through 15A and 15B are cross-sectional views for describing a method of manufacturing a semiconductor device, according to an embodiment of the present inventive concepts. FIGS. 7A and 7B through 15A and 15B show a method of manufacturing the semiconductor device 300 shown in FIGS. 4A through 5B.

Like FIG. 5A, FIGS. 7A, 8A, 9A, 10A, 11A, 12A, 13A, 14A, and 15A are cross-sectional views taken along lines corresponding to the lines 5AX1-5AX1' and 5AX2-5AX2' of FIG. 4A. Like FIG. 5B, FIGS. 7B, 8B, 9B, 10B, 11B, 12B, 13B, 14B, and 15B are cross-sectional views taken along lines corresponding to the lines 5BY1-5BY1' and 5BY2-5BY2' of FIG. 4A.

In FIGS. 1 through 15B, the same elements are denoted by the same reference numerals, and a repeated explanation thereof will not be given for simplification of description.

Figure 7A:
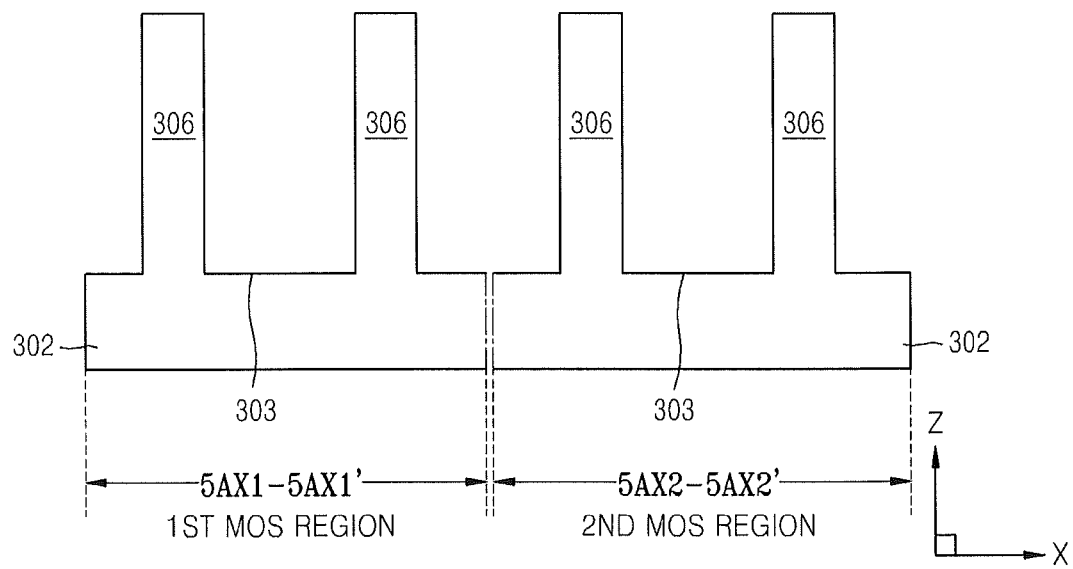
Figure 7B:
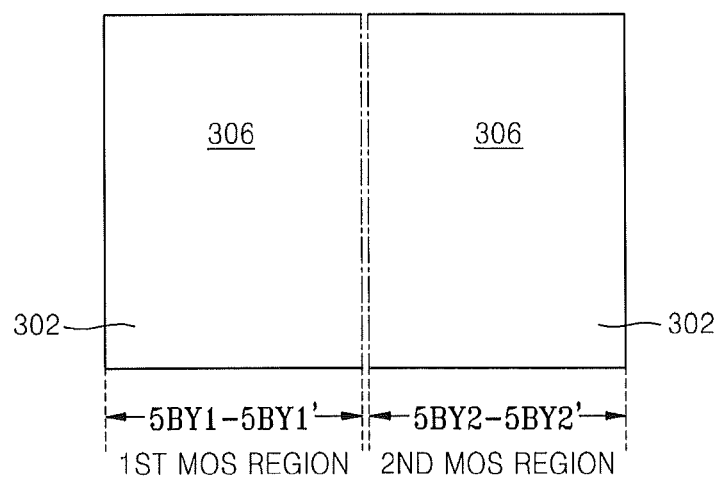

Referring to FIGS. 7A and 7B, the substrate 302 having the first MOS region 1ST MOS REGION and the second MOS region 2ND MOS REGION is prepared.

In some embodiments of the inventive concepts, the first MOS region 1ST MOS REGION of the substrate 302 is a region for forming a plurality of NMOS transistors and the second MOS region 2ND MOS REGION of the substrate 302 is a region for forming a plurality of PMOS transistors. In other words, the transistors are of different conductivity types. The detailed description of the substrate 302 may refer to the detailed description of the substrate 102 described with reference to FIGS. 1A through 2.

A plurality of device separation trenches 303 may be respectively formed in the first MOS region 1ST MOS REGION and the second MOS region 2ND MOS REGION of the substrate 302 so as to form the fin-type active regions 306 that protrude from the substrate 302 upwards and extend in one direction (for example, a direction perpendicular to an X direction and a Y direction of FIG. 7A).

The fin-type active regions 306 may include P-type and N-type impurity diffusion regions (not shown). In addition, the fin-type active regions 306 may include a plurality of source/drain regions (not shown).

Figure 8A:
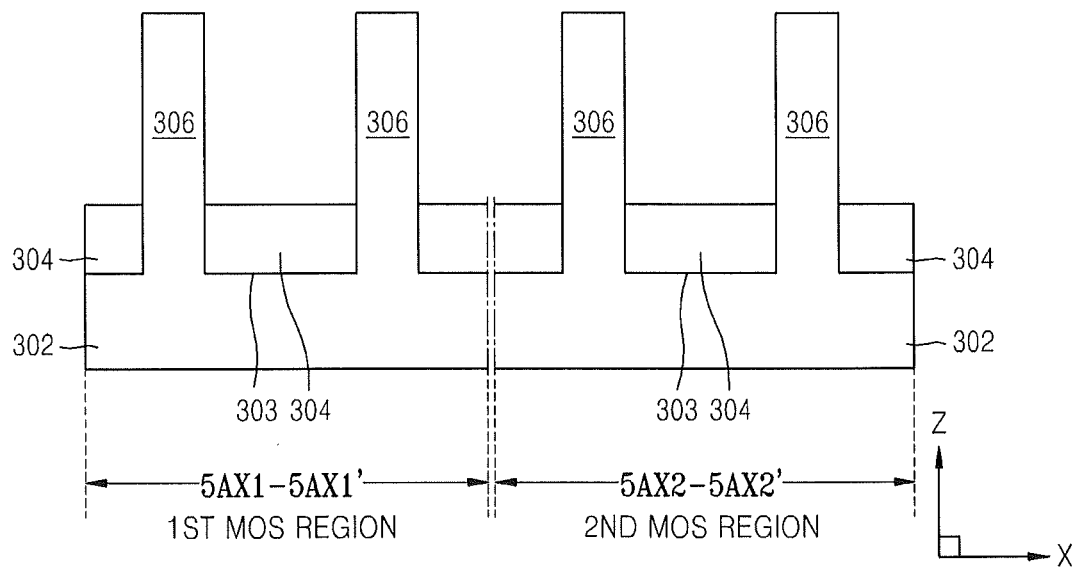
Figure 8B:
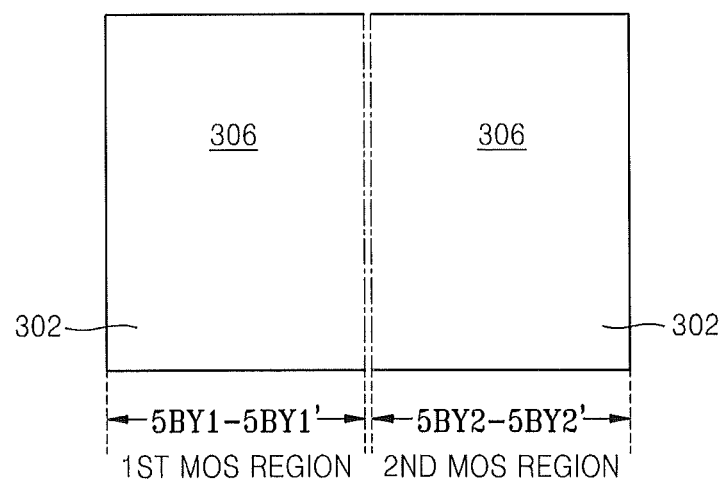

Referring to FIGS. 8A and 8B, the isolation layers 304 are formed to partially fill the device separation trenches 303 by forming an insulating layer to fill the device separation trenches 303 and to cover the fin-type active regions 306 and then etching-back the insulating layer such that the insulating layer may partially remain only on a lower portion of the device separation trenches 303. Thus, the fin-type active regions 306 are exposed over upper surfaces of the isolation layers 304.

The isolation layers 304 may include a silicon oxide layer, a silicon nitride layer, a silicon oxynitride layer, or a combination thereof. The isolation layers 304 may include an insulating liner (not shown) including a thermal oxide layer and fill insulating layers (not shown) that fill lower portions of the trenches 303 on the insulating liner.

Figure 9A:
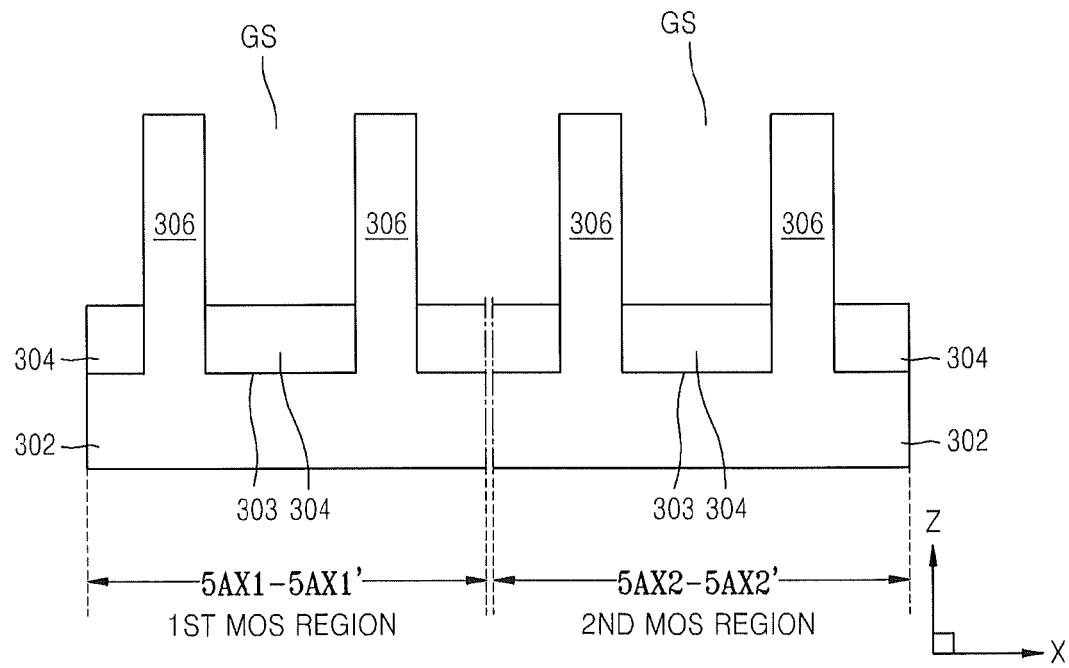
Figure 9B:
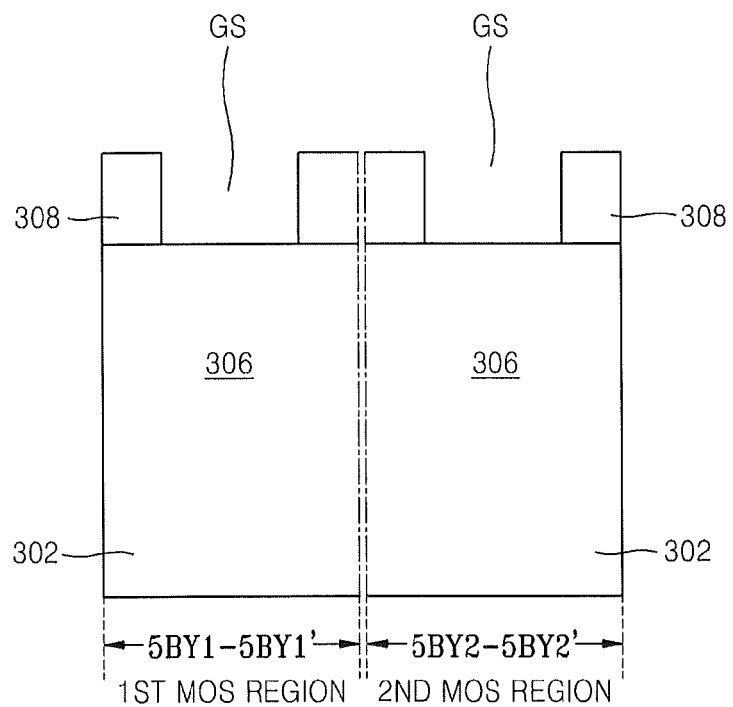

Referring to FIGS. 9A and 9B, a plurality of insulating layer patterns 308 extend in a direction so as to cover the isolation layers 304 and the fin-type active regions 306 and to cross the fin-type active regions 306 on the substrate 302.

The insulating layer patterns 308 define a plurality of gate spaces GSs in which the first gate structure 310A and the second gate structure 310B (refer to FIGS. 4A and 4B) are to be formed on the isolation layers 304 and the fin-type active regions 306.

Figure 10A:
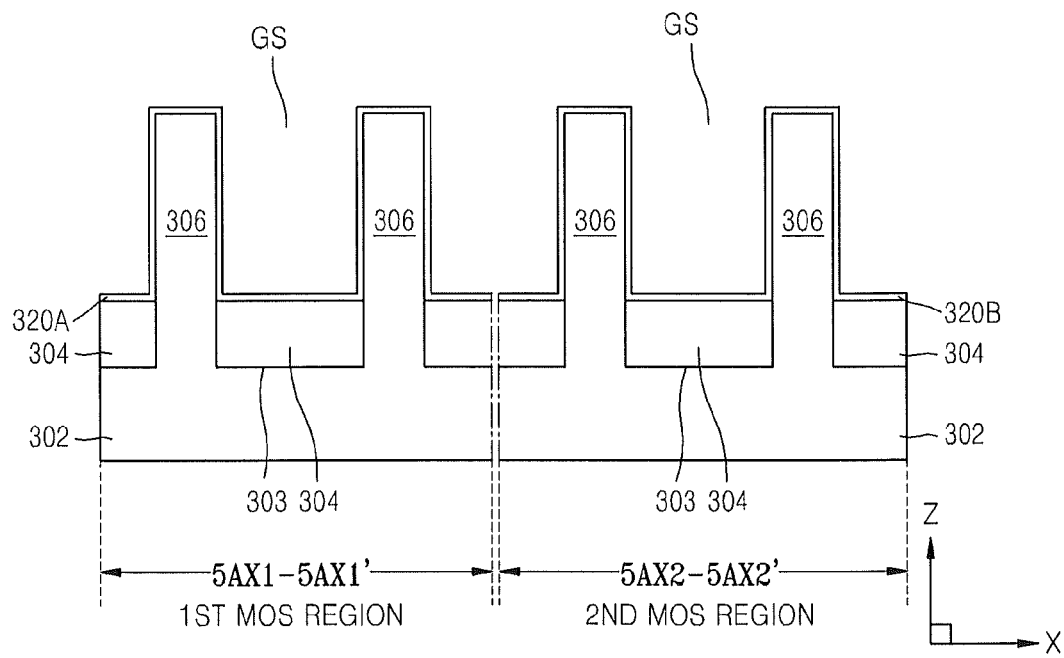
Figure 10B:
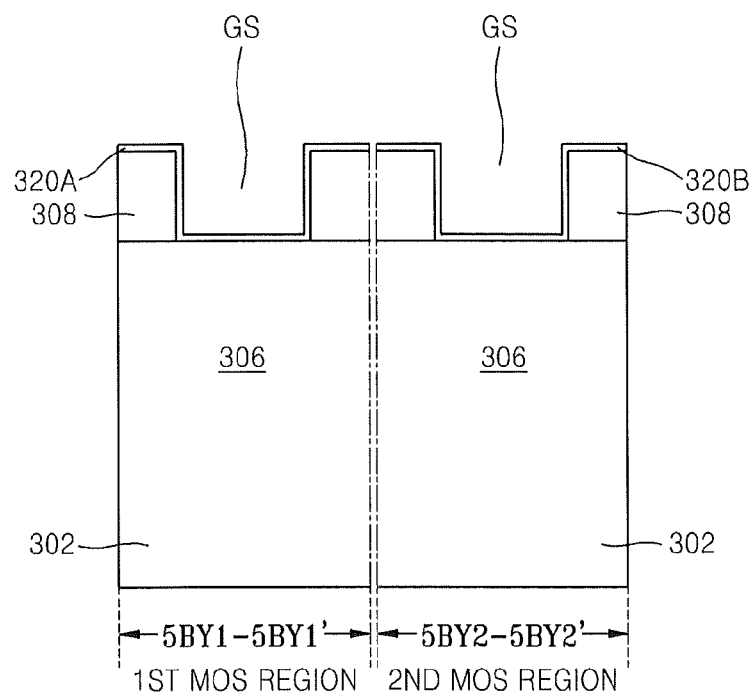

Referring to FIGS. 10A and 10B, in the first MOS region 1ST MOS REGION and the second MOS region 2ND MOS REGION, gate dielectric layers 320A and 320B are formed to cover internal walls of the gate spaces GSs on the isolation layers 304 and the fin-type active regions 306.

The gate dielectric layers 320A and 320B are formed to cover upper surfaces and opposite lateral surfaces of the fin-type active regions 306, upper surfaces of the isolation layers 304, and upper surfaces and opposite lateral surfaces of the insulating layer patterns 308. The gate dielectric layers 320A and 320B may cover the upper surfaces and opposite lateral surfaces of the fin-type active regions 306 to a uniform thickness. In some embodiments of the inventive concepts, the gate dielectric layers 320A and 320B may be formed via an ALD process. The gate dielectric layers 320A and 320B may be formed to have a thickness of about 1 to about 3 nm. The detailed description of the gate dielectric layers 320A and 320B may refer to the detailed description of the gate dielectric layer 120 described with reference to FIG. 2.

Figure 11A:
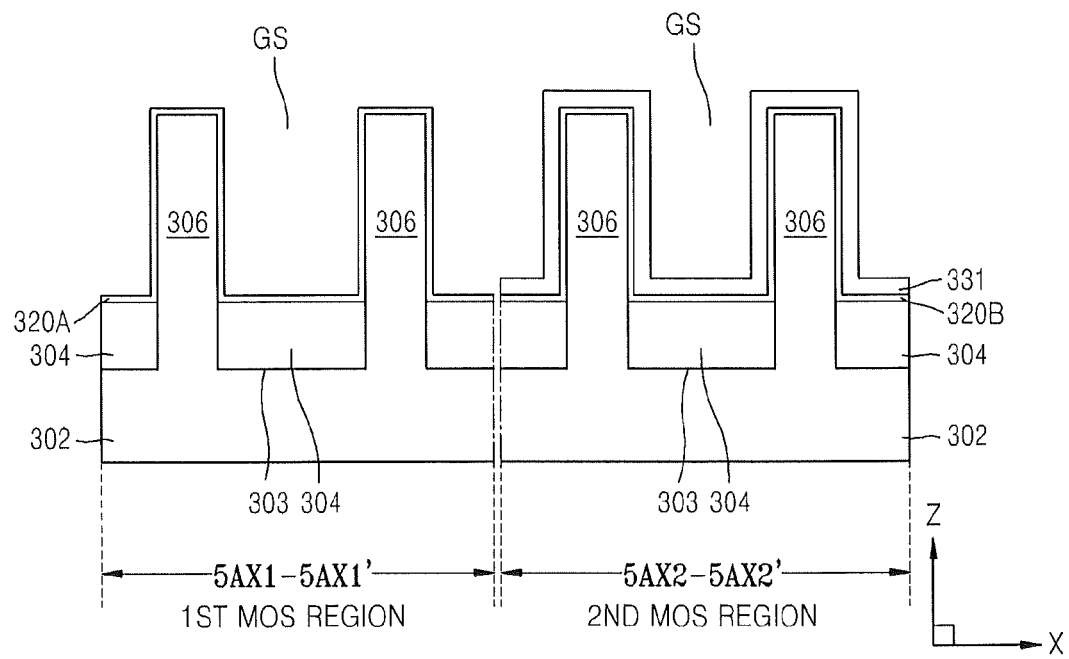
Figure 11B:
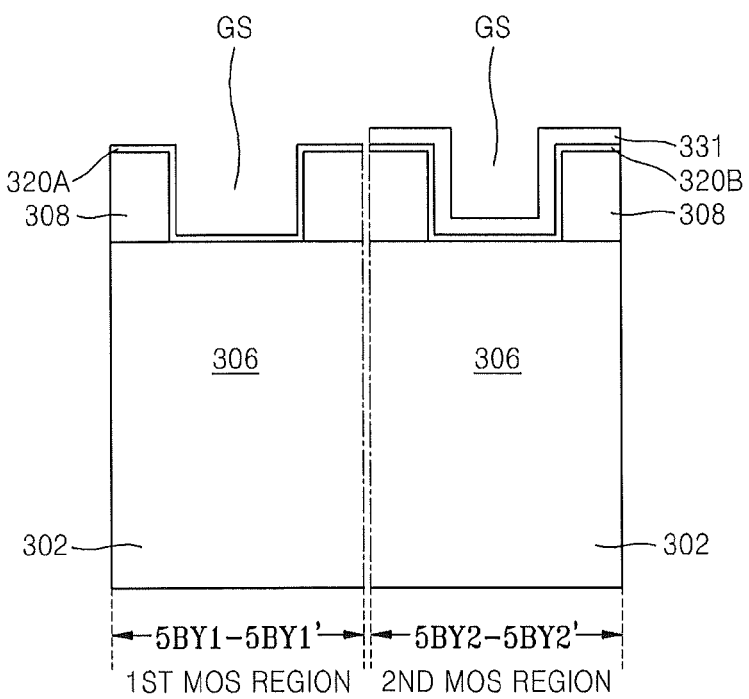

Referring to FIGS. 11A and 11B, the first metal nitride-containing layer 331 is selectively formed only in the second MOS region 2ND MOS REGION from among the first MOS region 1ST MOS REGION and the second MOS region 2ND MOS REGION.

In order to form the first metal nitride-containing layer 331, a blanket metal nitride-containing layer (not shown) may be formed to cover the gate dielectric layers 320A and 320B to a uniform thickness on the substrate 302 in the first MOS region 1ST MOS REGION and the second MOS region 2ND MOS REGION and then a portion of the blanket metal nitride-containing layer may be removed such that the first metal nitride-containing layer 331 that is the remaining portion of the blanket metal nitride-containing layer may remain only in the second MOS region 2ND MOS REGION. The blanket metal nitride-containing layer may be formed via an ALD process so as to cover the upper surfaces and opposite lateral surfaces of the fin-type active regions 306 in the first MOS region 1ST MOS REGION and the second MOS region 2ND MOS REGION.

The first metal nitride-containing layer 331 may cover the upper surfaces and opposite lateral surfaces of the fin-type active regions 306 to a uniform thickness on the second gate dielectric layer 320B. The first metal nitride-containing layer 331 may be formed to have a thickness of about 0.5 to about 7 nm.

Figure 12A:
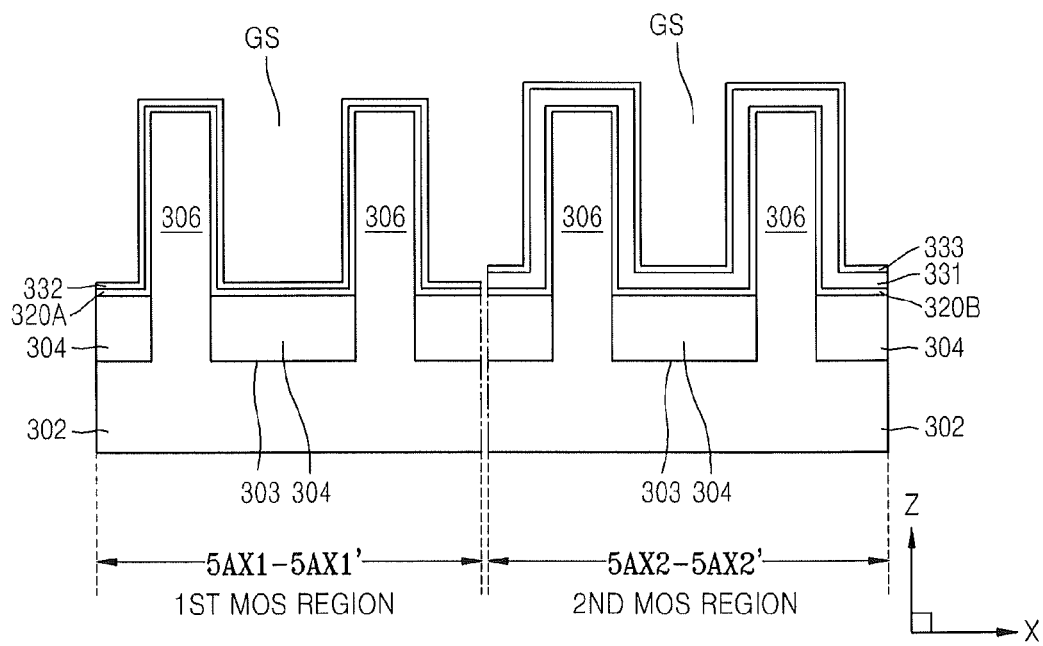
Figure 12B:
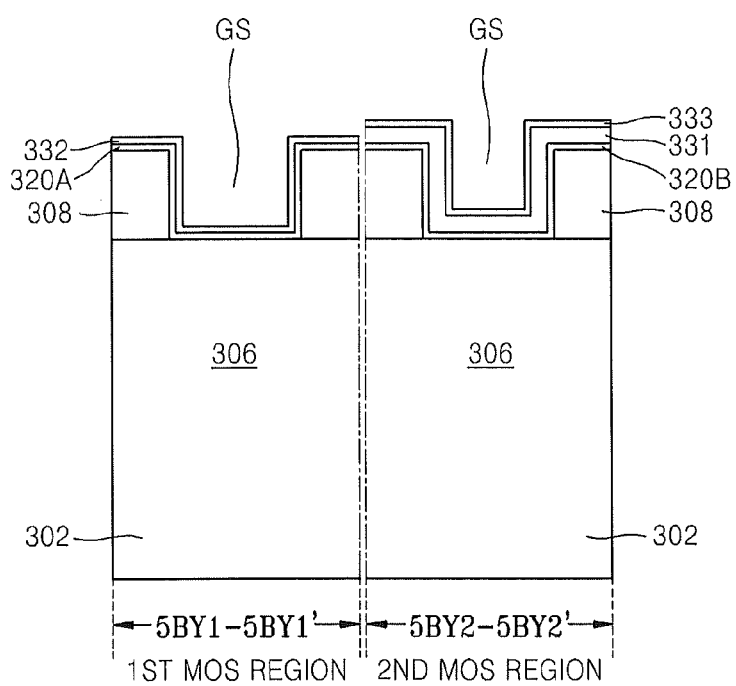

Referring to FIGS. 12A and 12B, a metal nitride-containing material is deposited on the substrate 302 in the first MOS region 1ST MOS REGION and the second MOS region 2ND MOS REGION such that the metal nitride-containing layer 332 is formed in the gate spaces GSs to cover the first gate dielectric layer 320A in the first MOS region 1ST MOS REGION and the second metal nitride-containing layer 333 is formed in the gate spaces GSs to cover the first metal nitride-containing layer 331 in the second MOS region 2ND MOS REGION. The metal nitride-containing material is deposited via an ALD process such that the metal nitride-containing layer 332 and the second metal nitride-containing layer 333 may be formed to cover upper surfaces and opposite lateral surfaces of a plurality of active regions to a uniform thickness.

In some embodiments of the inventive concepts, the metal nitride-containing layer 332 and the second metal nitride-containing layer 333 have the same composition and the same thickness. For example, the metal nitride-containing layer 332 and the second metal nitride-containing layer 333 may be formed to have a thickness of about 1 nm.

In some embodiments of the inventive concepts, a metal nitride-containing material may be deposited on the substrate 302 in the first MOS region 1ST MOS REGION and the second MOS region 2ND MOS REGION and then a portion of the metal nitride-containing material, which is deposited in a region except for the second MOS region 2ND MOS REGION, may be removed such that the metal nitride-containing material may partially remain only in the second MOS region 2ND MOS REGION. Thus, the metal nitride-containing layer 332 is not formed in the first MOS region 1ST MOS REGION.

Figure 13A:
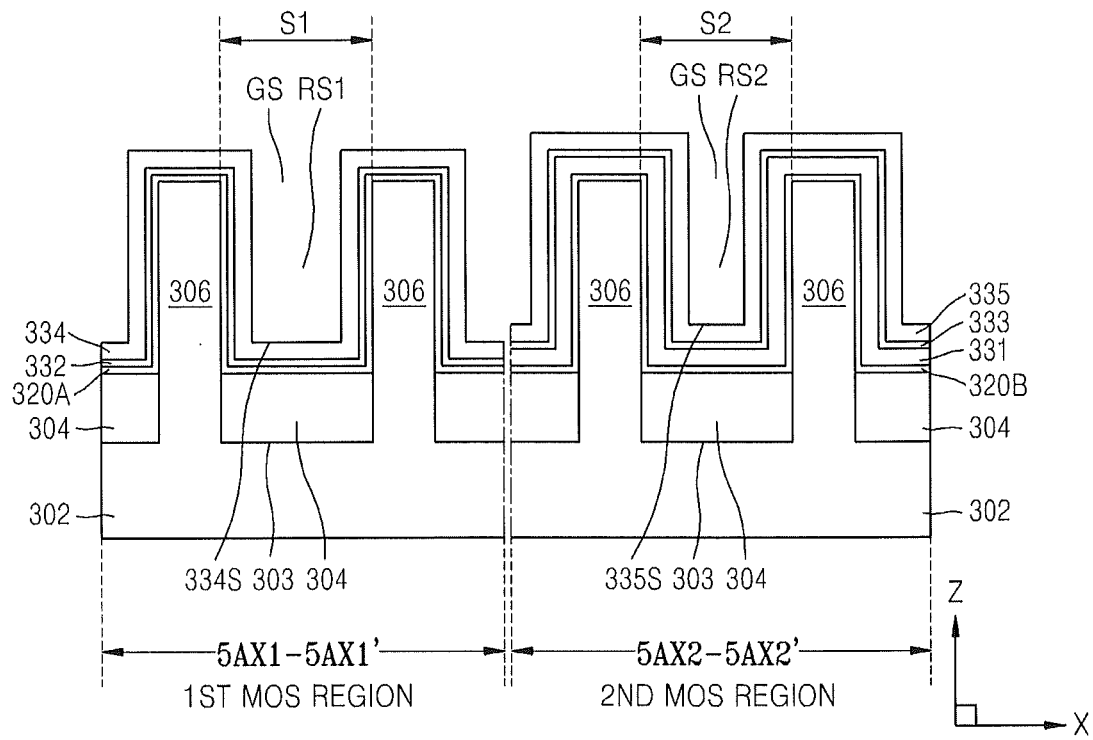
Figure 13B:
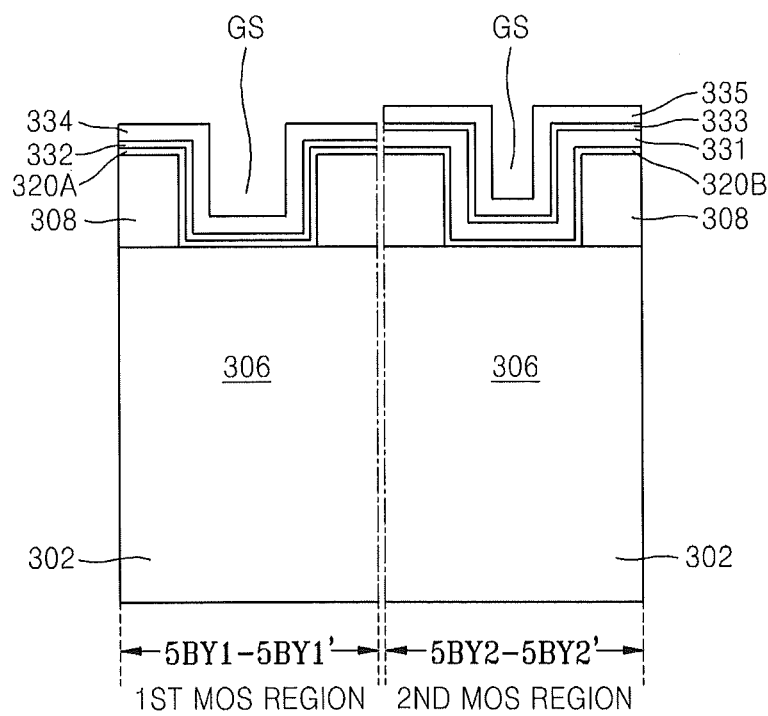

Referring to FIGS. 13A and 13B, an Al doped metal-containing material may be deposited on the metal nitride-containing layer 332 and the second metal nitride-containing layer 333 in the first MOS region 1ST MOS REGION and the second MOS region 2ND MOS REGION such that the Al doped metal-containing layer 334 is formed in the first MOS region 1ST MOS REGION to cover the metal nitride-containing layer 332 and the Al doped metal-containing layer 335 is formed in the second MOS region 2ND MOS REGION to cover the second metal nitride-containing layer 333.

The step difference 334S for defining a recess space RS1 on the Al doped metal-containing layer 334 is formed on an upper surface of the Al doped metal-containing layer 334 in the first space S1 between the fin-type active regions 306. The step difference portion 335S for defining on the Al doped metal-containing layer 335 is formed on an upper surface of Al doped metal-containing layer 335 in the second space S2 between the fin-type active regions 306.

In some embodiments of the inventive concepts, the Al doped metal-containing layers 334 and 335 have the same composition and the same thickness. For example, the Al doped metal-containing layers 334 and 335 may be formed to have a thickness of about 1 to about 6 nm.

The Al doped metal-containing material is deposited via an ALD process such that the Al doped metal-containing layers 334 and 335 may be formed to cover the upper surfaces and opposite lateral surfaces of the fin-type active regions 306 to a uniform thickness.

Figure 16:
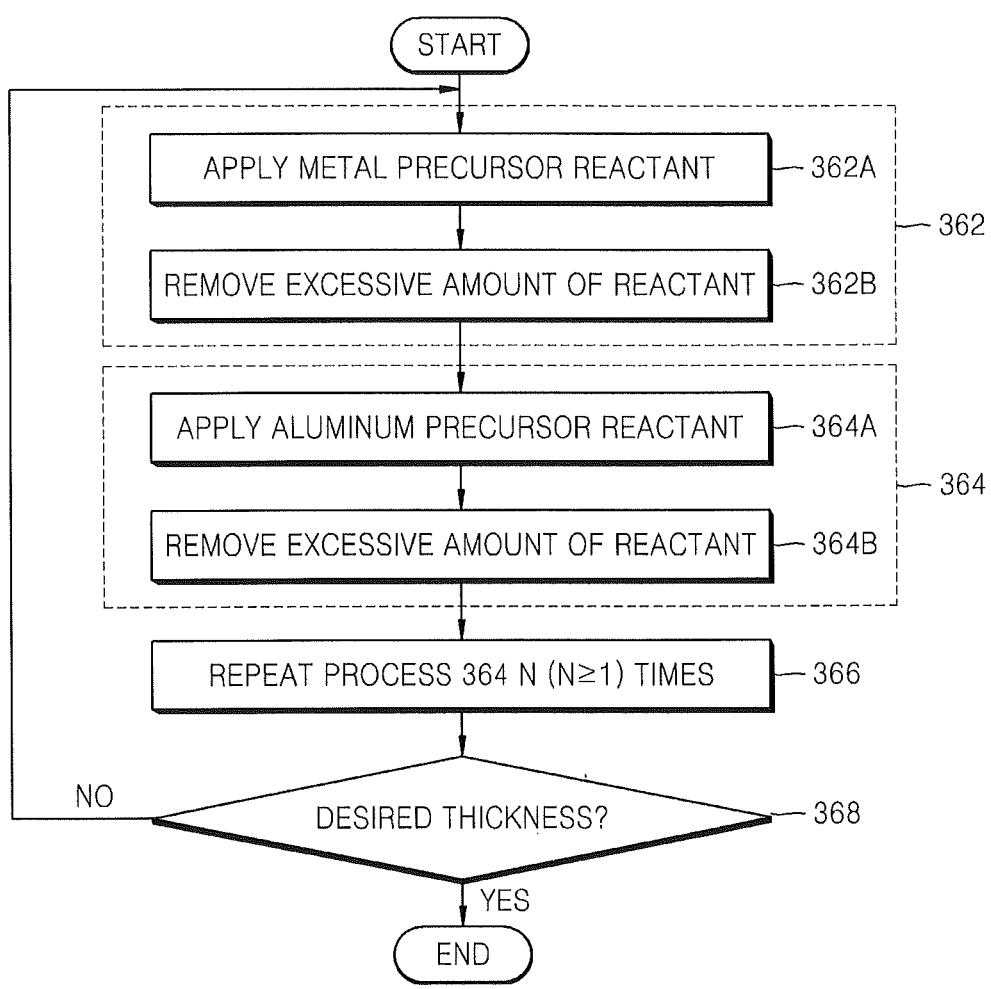
FIG. 16 is a flowchart showing a gas pulsing sequence of an atomic layer deposition (ALD) process for forming aluminum (Al) doped metal-containing layers in a process described with reference to FIGS. 13A and 13B, according to an embodiment of the inventive concepts.

FIG. 16 is a flowchart showing a gas pulsing sequence of an ALD process for forming the Al doped metal-containing layers 334 and 335 in a process described with reference to FIGS. 13A and 13B, according to an embodiment of the inventive concepts.

Referring to FIG. 16, with regard to an ALD process for forming the Al doped metal-containing layers 334 and 335 on the substrate 302 over which the metal nitride-containing layer 332 and the second metal nitride-containing layer 333 are exposed, one deposition cycle of the ALD process may include performing a process 362 of applying a metal precursor reactant to the substrate 302 one time and performing a process 364 of applying an Al precursor reactant onto the substrate 302, on which a chemical adsorbing layer formed of the metal precursor is formed, a plurality of times.

In more detail, in a sub-process 362A of a process 362, the metal precursor reactant is applied to the substrate 302 over which the metal nitride-containing layer 332 and the second metal nitride-containing layer 333 are exposed, in an ALD reaction chamber such that the metal precursor may be adsorbed onto exposed surfaces of the metal nitride-containing layer 332 and the second metal nitride-containing layer 333.

In some embodiments of the inventive concepts, the metal precursor reactant may include a Ta precursor. The Ta precursor may include an inorganic Ta precursor or an organic Ta precursor. In some embodiments of the inventive concepts, the Ta precursor includes Ta halide. For example, the Ta precursor may include $TaF_w$, $TaCl_x$, $TaBr_y$, and/or $TaI_z$ (w, x, y, and z are each an integer of 1 to 5). Alternatively, the Ta precursor may include 1-methoxy-2-methyl-2-propanolate $(Ta(OMe))_4$ and/or 1-methoxy-2-methyl-2-propanolate $(Ta(OEt)_4)$.

In a sub-process 362B of the process 362, an excessive amount of the metal precursor reactant, which remains in the ALD reaction chamber, is purged by using an inert gas and is removed.

In a sub-process 364A of the process 364, an Al precursor reactant is applied onto the substrate 302 to which the metal precursor is chemical-adsorbed, in the ALD reaction chamber so as to induce a reaction with the chemical adsorbing layer formed on the substrate 302 and including a metal precursor.

In some embodiments of the inventive concepts, the Al precursor reactant may include an inorganic Al precursor or an organic Al precursor. For example, the Al precursor reactant may include $AlH_3$, $AlCl_3$, $AlBr_3$, $AlI_3$, $AlMe_3$, $AlEt_3$, $AlMe_2H$, $[Al(OsBu)_3]_4$, $Al(CH_3COCHCOCH_3)_3$, $Al(OiPr)_3$, $[Al(NMe_2)_3]_2$, $Al(iBu)_2Cl$, $Al(iBu)_3$, $Al(tBu)_3$, $Al(iBu)_2H$, $AlEt_2Cl$, $Et_3Al_2(OsBu)_3$, $Al(THD)_3$, $H_3AlNMe_3$, $H_3AlNEt_3$, $H_3AlNMe_2Et$ and/or $H_3AlMeEt_2$.

In a sub-process 364B of the process 364, an excessive amount of the Al reactant, which remains in the ALD reaction chamber, is purged by using an inert gas and is removed.

In a process 366, the process 364 described above is repeated N times. In this case, N is an integer equal to or greater than 1. For example, the process 364 may be repeated one time, two times, three times, or more. The number of times the process 364 is repeated is increased, the amount of Al in the Al doped metal-containing layers 334 and 335 is increased.

When a Ta precursor is used as the metal precursor reactant, the Al doped metal-containing layers 334 and 335 includes a $Ta_xAl_yC_z$ layer (x, y, and z are each atomic %, and x+y+z≤100). When an NMOS transistor is formed in the first MOS region 1ST MOS REGION, as an atomic ratio of Al/Ta in the $Ta_xAl_yC_z$ layer included in the Al doped metal-containing layer 334 is increased, a work function of an NMOS transistor may be reduced, thereby improving work function properties. In some embodiments of the inventive concepts, the number of times the process 364 is repeated may be determined such that an atomic ratio of Al/Ta in the $Ta_xAl_yC_z$ layer is greater than 1.

In other embodiments of the inventive concepts, an Hf precursor, a W precursor and/or a V precursor may be used as the metal precursor reactant. In this case, an Al doped hafnium carbide-containing layer, an Al doped tungsten carbide-containing layer and/or an Al doped vanadium carbide-containing layer may be formed as the Al doped metal-containing layers 334 and 335.

In the process 362 and the process 364, the metal precursor reactant and the Al precursor reactant may be appropriately selected to control the amount of carbon contained in the Al doped metal-containing layers 334 and 335. For example, during an ALD process for forming the Al doped metal-containing layers 334 and 335, an organic material may not be used as the metal precursor reactant and the Al precursor reactant such that carbon may not be included in the Al doped metal-containing layers 334 and 335 or the amount of carbon contained in the Al doped metal-containing layers 334 and 335 may be controlled to be about 3 atomic % or less.

In a process 368, whether the Al doped metal-containing layers 334 and 335 having a desired thickness are obtained is determined. When the total thickness of the Al doped metal-containing layers 334 and 335 is less than the desired thickness, the processes 362, 364, and 366 are repeated. In the process 368, when it is determined that the total thickness of the Al doped metal-containing layers 334 and 335 is the desired thickness, a process for forming the Al doped metal-containing layers 334 and 335 is terminated.

Figure 17:
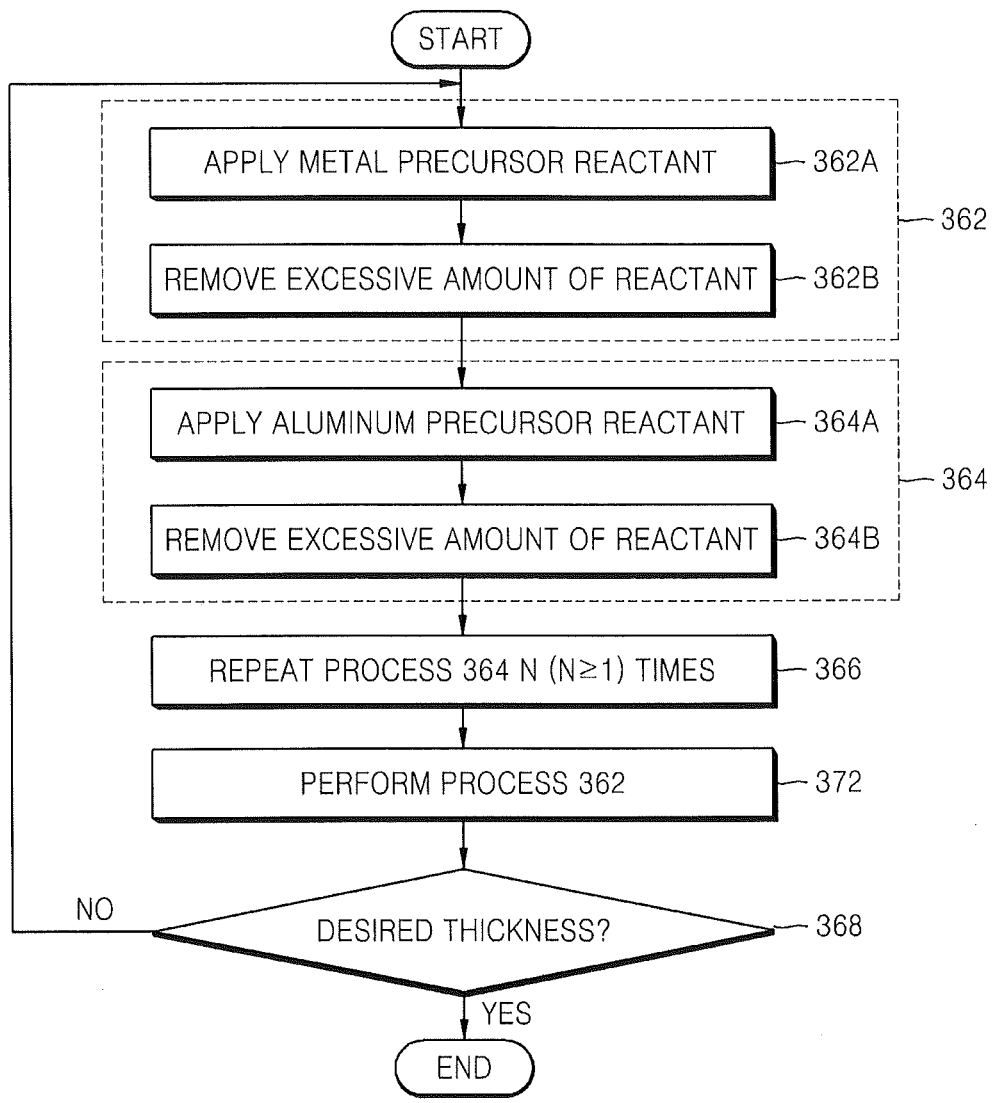
FIG. 17 is a flowchart showing a gas pulsing sequence of an ALD process for forming an Al doped metal-containing layers in a process described with reference to FIGS. 13A and 13B, according to another embodiment of the inventive concepts.

FIG. 17 is a flowchart showing a gas pulsing sequence of an ALD process for forming the Al doped metal-containing layers 334 and 335 in a process described with reference to FIGS. 13A and 13B, according to another embodiment of the inventive concepts.

The ALD process shown in FIG. 17 is similar to the ALD process shown in FIG. 16. The process 368 of determining whether the Al doped metal-containing layers 334 and 335 having a desired thickness are obtained is performed after a process 372 for performing the process 362 one more time is performed.

Subsequent to the process 372, when it is determined that the total thickness of the Al doped metal-containing layers 334 and 335 is a desired thickness in the process 368, a process for forming the Al doped metal-containing layers 334 and 335 is terminated. When a Ta precursor is used as the metal precursor reactant, the uppermost surface of the Al doped metal-containing layers 334 and 335 may have a structure including a chemical adsorbing layer of a metal precursor immediately after the Al doped metal-containing layers 334 and 335 are formed.

Figure 14A:
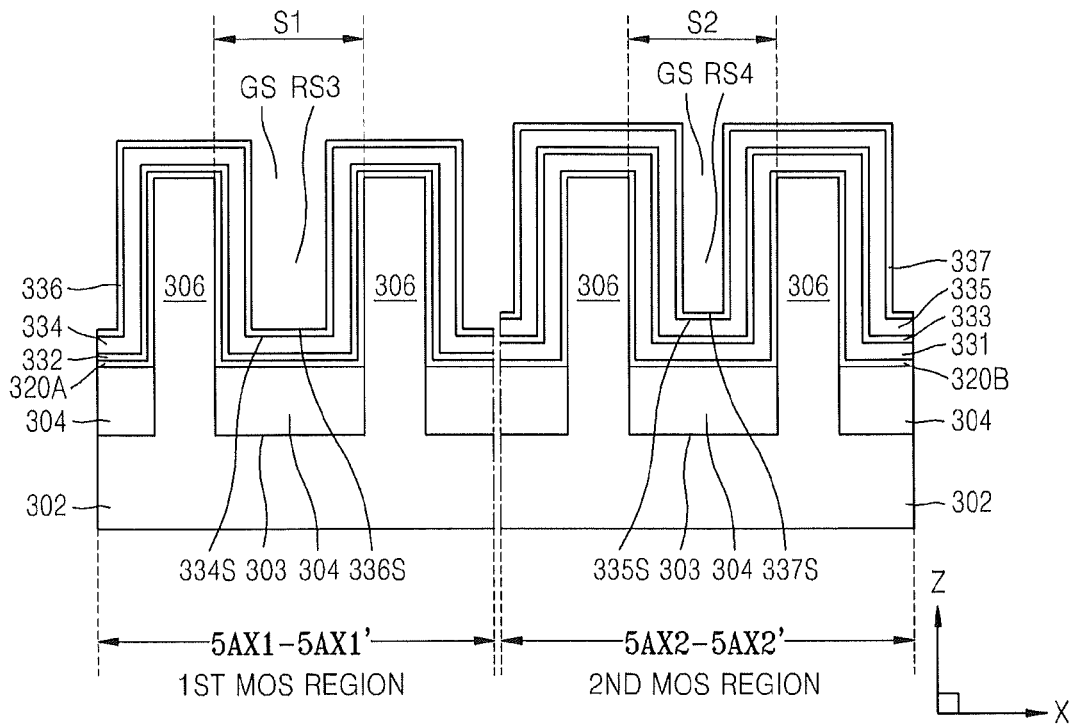
Figure 14B:
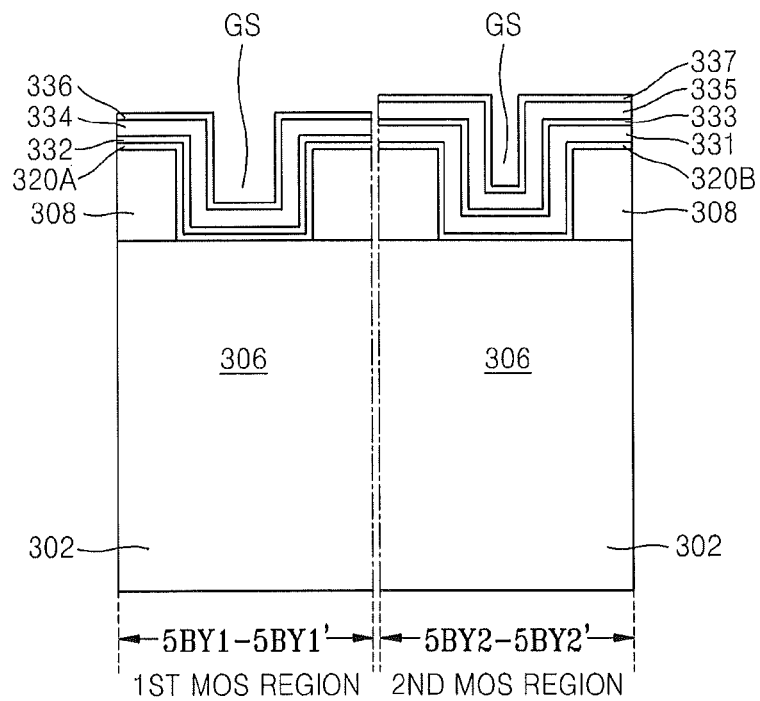

Referring to FIGS. 14A and 14B, metal nitride is deposited on the Al doped metal-containing layers 334 and 335 in the first MOS region 1ST MOS REGION and the second MOS region 2ND MOS REGION such that the conductive capping layer 336 is formed to cover the Al doped metal-containing layer 334 in the first MOS region 1ST MOS REGION and the conductive capping layer 337 is formed to cover the Al doped metal-containing layer 335 in the second MOS region 2ND MOS REGION. The conductive capping layers 336 and 337 may include TiN, TaN, or a combination thereof that is obtained via an ALD process.

The step difference 336S for defining a recess space RS3 on the conductive capping layer 336 is formed on the upper surface of the conductive capping layer 336 in the first space S1 between the fin-type active regions 306. The step difference 337S for defining a recess space RS4 on the conductive capping layer 337 is formed on the upper surface of the conductive capping layer 337 in the second space S2 between the fin-type active regions 306. The conductive capping layers 336 and 337 may have the same composition and the same thickness. For example, the conductive capping layers 336 and 337 may be formed to have a thickness of about 0 to about 3 nm. In some embodiments of the inventive concepts, the conductive capping layers 336 and 337 are formed via an ALD process. The conductive capping layers 336 and 337 may be formed via an ALD process such that the conductive capping layers 336 and 337 may cover upper surfaces and opposite lateral surfaces of a plurality of active regions to a uniform thickness. The detailed description of the conductive capping layers 336 and 337 may refer to the detailed description of the conductive capping layer 136 described with reference to FIG. 2. In some embodiments of the inventive concepts, the conductive capping layers 336 and 337 may be omitted.

Figure 15A:
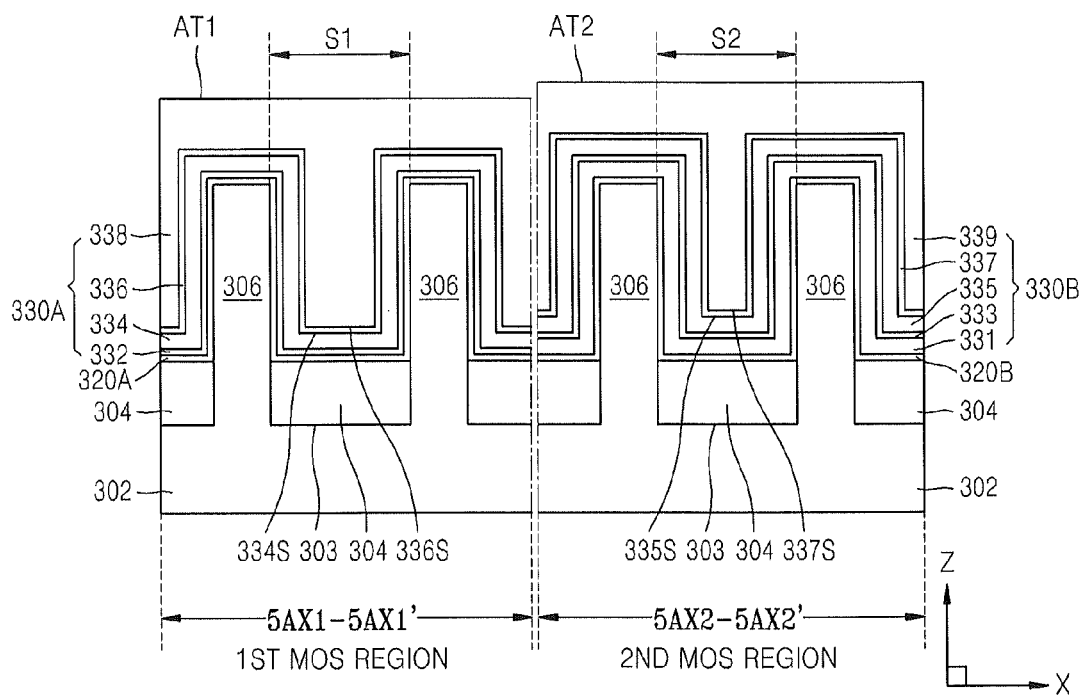
Figure 15B:
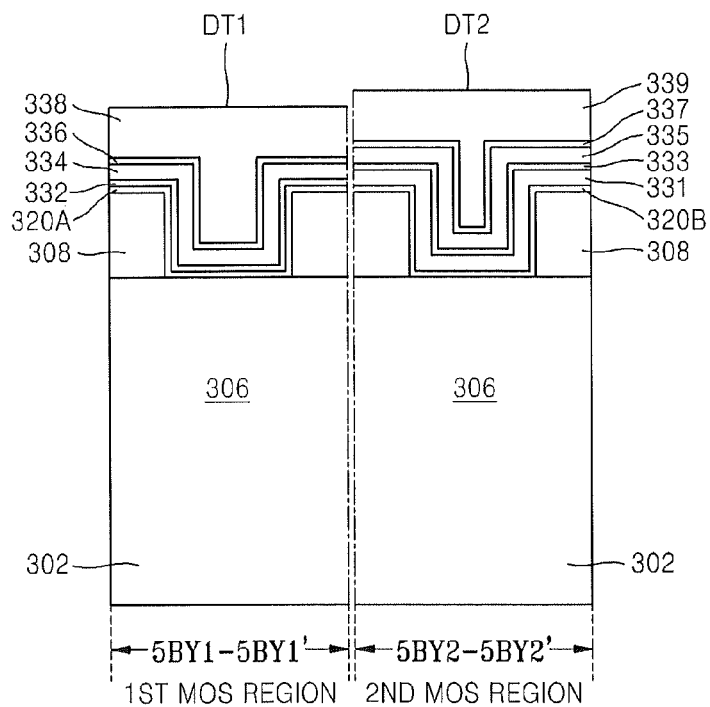

Referring to FIGS. 15A and 15B, a metal layer having excellent gap-fill properties is formed on the conductive capping layers 336 and 337 in the first MOS region 1ST MOS REGION and the second MOS region 2ND MOS REGION. Thus, in the first MOS region 1ST MOS REGION, the gap-fill metal layer 338 is formed in the first space S1 between the fin-type active regions 306 so as to fill and cover the recess space RS3 on the conductive capping layer 336 and to cover the conductive capping layer 336. In the second MOS region 2ND MOS REGION, the gap-fill metal layer 339 is formed in the second space S2 between the fin-type active regions 306 so as to fill and cover a recess space RS4 on the conductive capping layer 337 and to cover the conductive capping layer 337. Thus, the first gate line 330A and the second gate line 330B are formed in the first MOS region 1ST MOS REGION and the second MOS region 2ND MOS REGION.

In some embodiments of the inventive concepts, the gap-fill metal layers 338 and 339 include W and/or TiN. The gap-fill metal layers 338 and 339 may be formed via an ALD, CVD and/or PVD process. The gap-fill metal layers 338 and 339 may fill and cover the recess spaces RS3 and RS4 formed on the step differences 336S and 337S of the conductive capping layers 336 and 337 in the first space S1 and the second space S2 without forming any void, respectively.

In FIGS. 15A and 15B, a step difference may be formed on the upper surfaces of the gap-fill metal layers 338 and 339 according to a position. For example, the gap-fill metal layers 338 and 339 may have upper surfaces AT1 and AT2 having a relatively low level on the fin-type active regions 306 shown in FIG. 15A. In addition, the gap-fill metal layers 338 and 339 may have upper surfaces DT1 and DT2 having a relatively high level on the insulating layer patterns 308 shown in FIG. 15B.

Then, portions of the gate dielectric layers 320A and 320B, the first gate line 330A, and the second gate line 330B, which are disposed over the insulating layer patterns 308, may be removed such that the upper surfaces of the insulating layer patterns 308 may be exposed and the first gate line 330A and the second gate line 330B may remain only in the gate spaces GS, thereby obtaining a structure as shown in FIGS. 5A and 5B.

Figure 18:
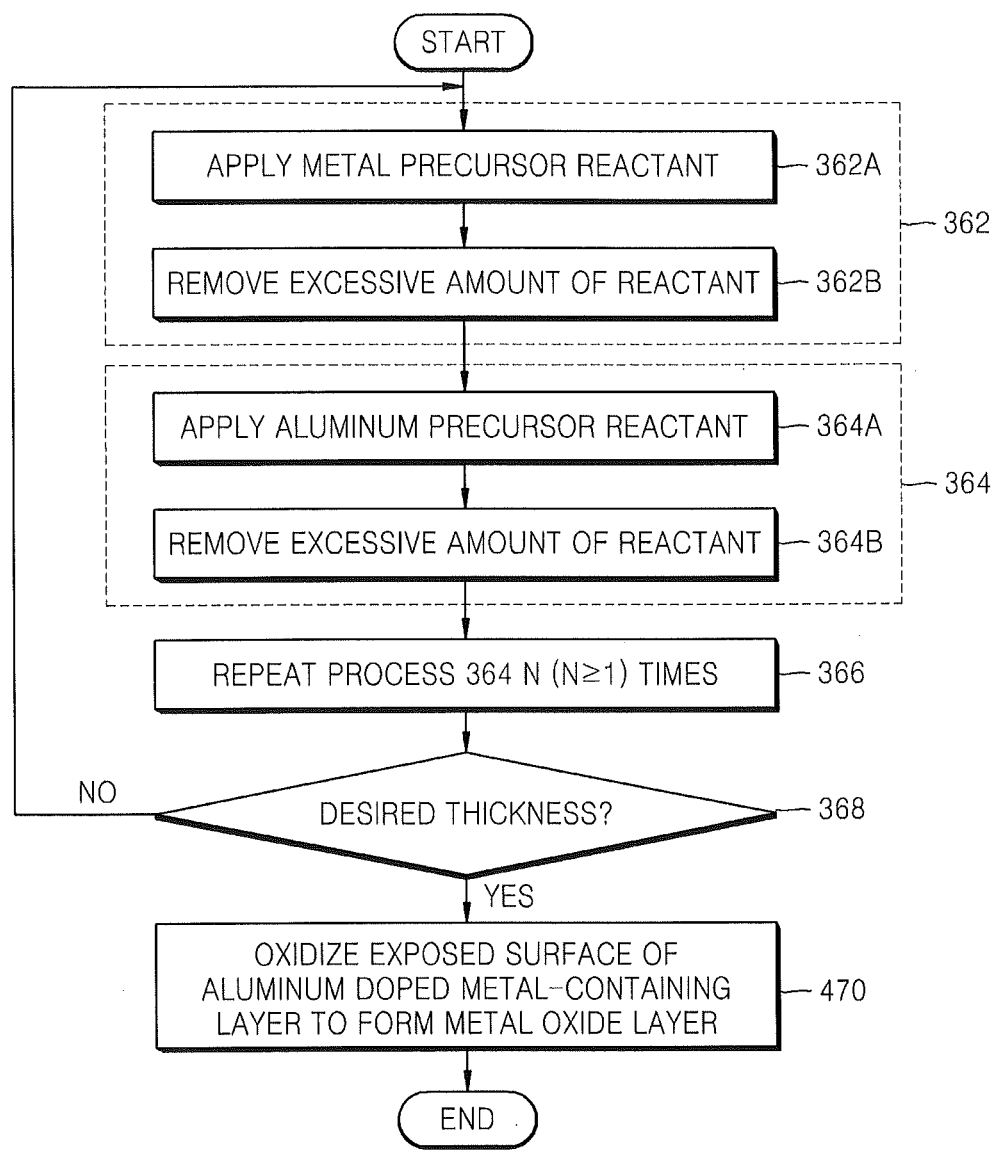
FIG. 18 is a flowchart showing a method of manufacturing a semiconductor device, according to another embodiment of the inventive concepts.

FIG. 18 is a flowchart showing a method of manufacturing a semiconductor device, according to another embodiment of the inventive concepts. FIG. 18 shows a method of manufacturing the semiconductor device 400 shown in FIGS. 6A and 6B, in particular, a method of forming the gate lines 430A and 430B (refer to FIGS. 6A and 6B) including the metal oxide layers 435.

The method of manufacturing the semiconductor device 400 according to the present embodiment is almost the same as the method of manufacturing the semiconductor device 300 described with reference to FIGS. 7A and 7B through 15A and 15B. The processes 362, 364, and 366 are repeated via the ALD process described with reference to FIG. 16 so as to form the Al doped metal-containing layers 334 and 335 having a desired thickness. Then, in a process 470, an oxidation process is performed on the exposed surfaces of the Al doped metal-containing layers 334 and 335 so as to form the metal oxide layers 435 (refer to FIGS. 6A and 6B) that cover the Al doped metal-containing layers 334 and 335. The oxidation process may be performed in air or oxygen-containing conditions.

As shown in FIG. 18, when the process 470 subsequent to the process 366 for repeatedly applying an Al precursor reactant may be formed to form the metal oxide layers 435, the uppermost surface of the metal oxide layers 435 may include an aluminum oxide layer. In some embodiments of the inventive concepts, the thickness of the metal oxide layers 435 may be increased according to a period of time when the Al doped metal-containing layers 334 and 335 are exposed to oxygen conditions or an oxygen concentration of the oxygen conditions. In some embodiments of the inventive concepts, the metal oxide layers 435 may include only an aluminum oxide layer formed directly on the Al doped metal-containing layers 334 and 335. In other some embodiments of the inventive concepts, when a Ta precursor is used as the metal precursor reactant, the metal oxide layers 435 may include an AlO layer constituting the uppermost surface of the metal oxide layers 435, and a TaO layer formed directly below the AlO layer between the AlO layer and the Al doped metal-containing layers 334 and 335.

Figure 19:
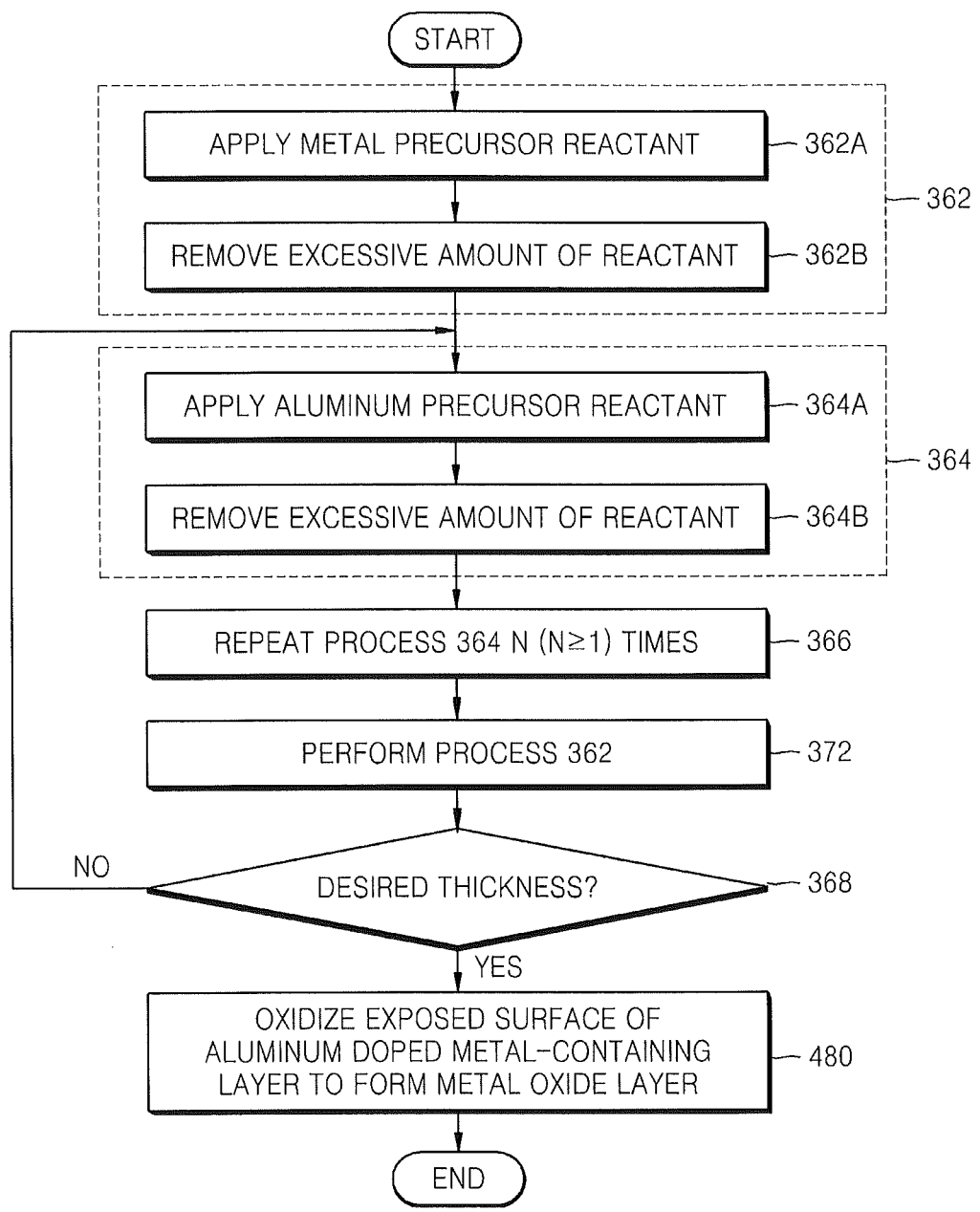
FIG. 19 is a flowchart showing a method of manufacturing a semiconductor device, according to another embodiment of the inventive concepts.

FIG. 19 is a flowchart showing a method of manufacturing a semiconductor device, according to another embodiment of the inventive concepts. FIG. 19 shows a method of manufacturing the semiconductor device 400 shown in FIGS. 6A and 6B, in particular, a method of forming the gate lines 430A and 430B (refer to FIGS. 6A and 6B) including the metal oxide layers 435.

The method of manufacturing the semiconductor device 400 according to the present embodiment is almost the same as the method of manufacturing the semiconductor device 300 described with reference to FIGS. 7A and 7B through 15A and 15B. The processes 362, 364, 366, and 372 are repeated via the ALD process described with reference to FIG. 17 so as to form the Al doped metal-containing layers 334 and 335 having a desired thickness. Then, in a process 480, an oxidation process is performed on the exposed surfaces of the Al doped metal-containing layers 334 and 335 so as to form the metal oxide layers 435 (refer to FIGS. 6A and 6B) that cover the Al doped metal-containing layers 334 and 335. The oxidation process may be performed in air or oxygen-containing conditions.

As shown in FIG. 19, when the metal oxide layers 435 are formed subsequent to the process 362 for applying the metal precursor reactant, if a Ta precursor is used as the metal precursor reactant, the uppermost surface of the metal oxide layers 435 may include a TaO layer. In some embodiments of the inventive concepts, the thickness of the metal oxide layers 435 may be increased according to a period of time when the Al doped metal-containing layers 334 and 335 are exposed to oxygen conditions or an oxygen concentration of the oxygen conditions. In some embodiments of the inventive concepts, when a Ta precursor is used as the metal precursor reactant, the metal oxide layers 435 may include only a TaO layer formed directly on the Al doped metal-containing layers 334 and 335. In other some embodiments of the inventive concepts, when a Ta precursor is used as the metal precursor reactant, the metal oxide layers 435 may include a TaO layer constituting the uppermost surface of the metal oxide layers 435 and an AlO layer formed directly below the TaO layer between the Al doped metal-containing layers 334 and 335 and the TaO layer.

In a method of manufacturing a semiconductor device according to embodiments of the inventive concepts, conductive layers constituting a gate line are formed to a uniform thickness on a plurality of fin-type active regions via an ALD process. Thus, upper surfaces and opposite lateral surfaces of the active regions are covered to a uniform thickness by the gate line. Thus, when a plurality of MOS transistors with a 3D structure are formed in the fin-type active regions, a fin-type field effect transistor (FinFET) structure having a reduced or minimized thickness deviation in the gate line that covers the upper surfaces and opposite lateral surfaces of the active regions having a large aspect ratio may be obtained. In addition, a space between the active regions having a large aspect ratio is filled and covered without forming any void by the gate line, and thus, a plurality of FinFETs having stable electrical properties may be obtained. In addition, a variation in the electrical properties of the FinFETs formed on a single substrate is reduced or minimized, and thus, a semiconductor device including the FinFETs having improved uniformity of electrical properties may be obtained.

Figure 20:
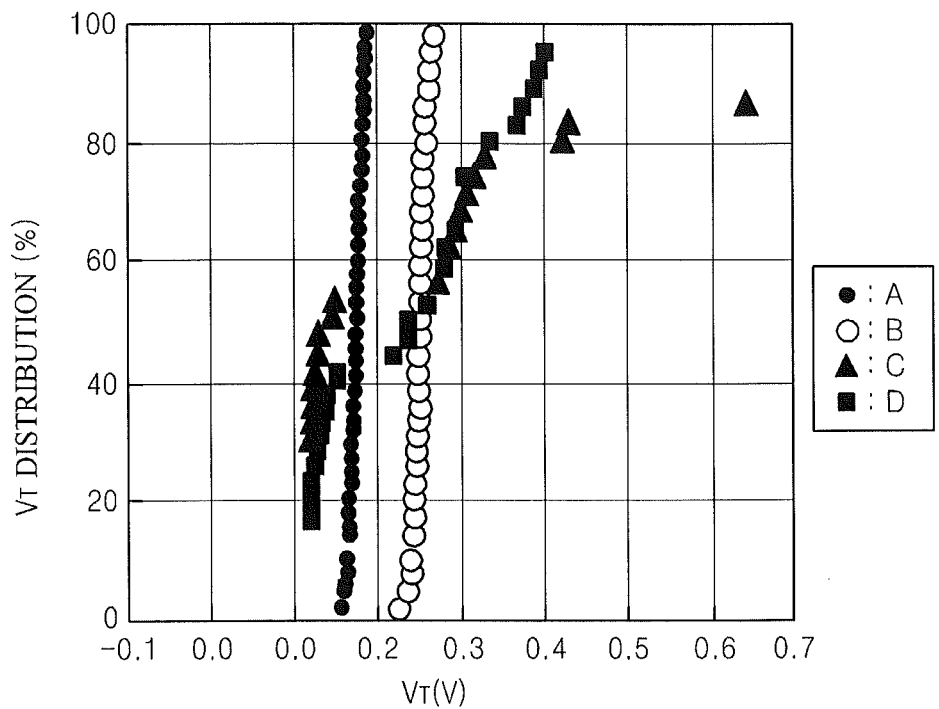
FIG. 20 is a graph showing an evaluation result of threshold voltage ($V_T$) properties of a semiconductor device, according to an embodiment of the inventive concepts.

FIG. 20 is a graph showing an evaluation result of threshold voltage (VT) properties of a semiconductor device, according to an embodiment of the inventive concepts.

In FIG. 20, an Al doped tantalum carbide layer (hereinafter, referred to as the "TaAlC layer") is formed as an Al doped metal-containing layer including a gate line in a semiconductor device according to the present embodiment, and threshold voltage (VT) properties according to forming conditions of the TaAlC layer are compared.

In FIG. 20, A corresponds to a case where the TaAlC layer is formed to a thickness of 100 Å via an ALD process and B corresponds to a case where the TaAlC layer is formed to a thickness of 50 Å via an ALD process.

C and D correspond to comparative examples. C corresponds to a case where a TiAl layer instead of the TaAlC layer is formed to a thickness of 100 Å via a PVD process and D corresponds to a case where a TiAl layer instead of the TaAlC layer is formed to a thickness of 50 Å via a PVD process.

From the result of FIG. 20, when the TaAlC layer is formed in the gate line of the semiconductor device to a thickness of 50 Å or more via an ALD process, it is confirmed that VT distribution is improved.

Figure 21:
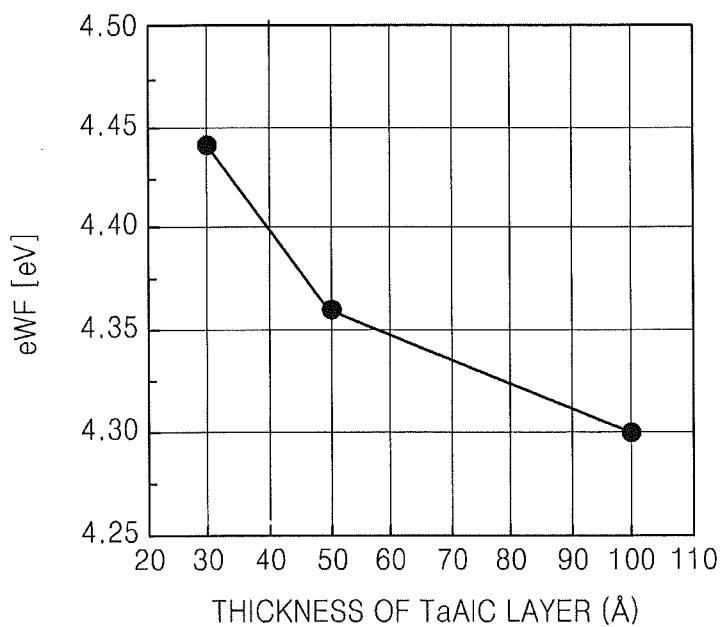
FIG. 21 is a graph showing an evaluation result of work function properties of a semiconductor device, according to an embodiment of the inventive concepts.

FIG. 21 is a graph showing an evaluation result of work function properties of an NMOS transistor of a semiconductor device, according to an embodiment of the inventive concepts.

For the evaluation of FIG. 21, a plurality of NMOS transistors are formed by forming gate lines including TaAlC layers having various thicknesses on a gate dielectric layer including a HfO layer and then work functions of the NMOS transistors are measured.

From the result of FIG. 21, it is confirmed that, as the thickness of the TaAlC layer is increased, a work function is reduced.

Figure 22:
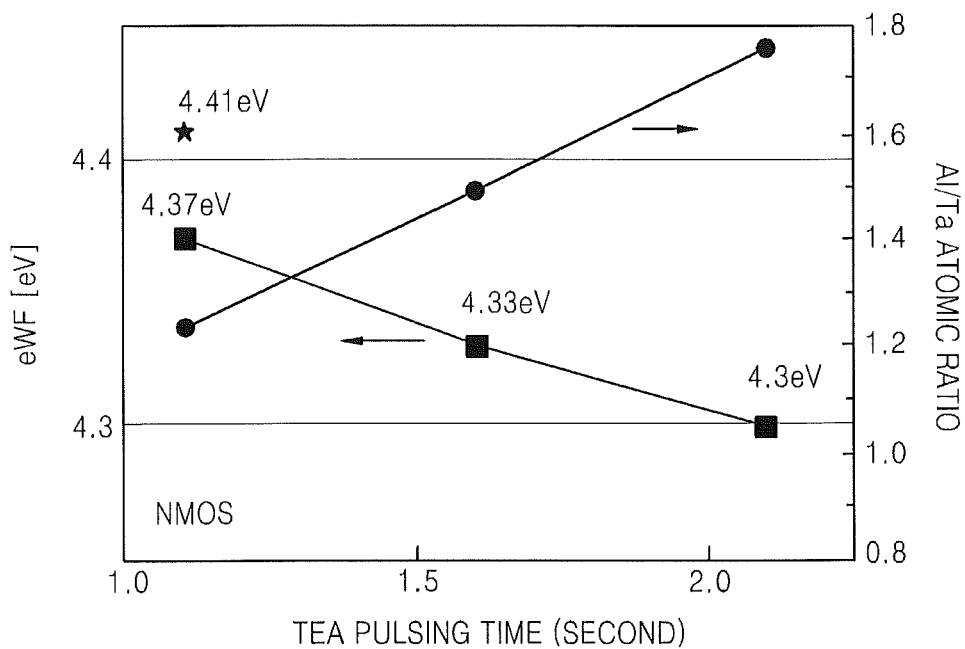
FIG. 22 is a graph showing work function properties of a semiconductor device and a measuring result of an atomic ratio of Al/Ta in a TaAlC layer, according to an embodiment of the inventive concepts.

FIG. 22 is a graph showing electron work function (eWF) properties of a semiconductor device and a measuring result of an atomic ratio of Al/Ta in a TaAlC layer, according to an embodiment of the inventive concepts.

For the evaluation of FIG. 22, a plurality of NMOS transistors are formed to include a gate line including a TiN layer that is formed to have a thickness of 10 Å via an ALD process, a TaAlC layer that is formed to have a thickness of 50 Å via an ALD process, a TiN layer that is formed to have a thickness of 20 Å via an ALD process, and a W layer that is formed to have a thickness of 50 Å via an ALD process, which are sequentially stacked on a gate dielectric layer including a HfO layer. The TaAlC layer of the gate line is formed in various conditions, and eWF properties according to forming conditions of the Al doped TaC layer and an atomic ratio of Al/Ta of the TaAlC layer are evaluated.

In order to form the TaAlC layer of the gate line of each of the NMOS transistors, an ALD process shown in FIG. 16 is performed by using TaCl5 as a metal precursor reactant and AlEt₃: triethyl aluminum (TEA) as an Al precursor reactant. In one deposition cycle of the ALD process, after TaCl5 is applied and purged one time, before TaCl5 is applied in a subsequent cycle, TEA is applied and purged three consecutive times to form TaAlC layers having a thickness of 50 Å. In this case, with regard to different periods of time when TEA is applied, work function properties are evaluated and an atomic ratio of Al/Ta of the TaAlC layer is measured. The result is shown in FIG. 22.

In FIG. 22, "★" is a comparative example that corresponds to a case where after TaCl5 is applied and purged one time, before TaCl5 is applied in a subsequent cycle, TEA is applied and purged one time only, in one cycle of an ALD process. FIG. 22 shows the evaluation result of eWF properties under the same conditions as the other evaluation results, except that an ALD deposition cycle taking 3.3 seconds to apply the TEA is repeated to form a TaAlC layer with a thickness of 50 Å.

From the result of FIG. 22, when TEA is applied and purged three consecutive times in one deposition cycle, as the period of time taken to apply TEA is increased, a work function is reduced, an atomic ratio of Al/Ta is increased, and the amount of Al contained in the TaAlC layer is increased.

Figure 23:
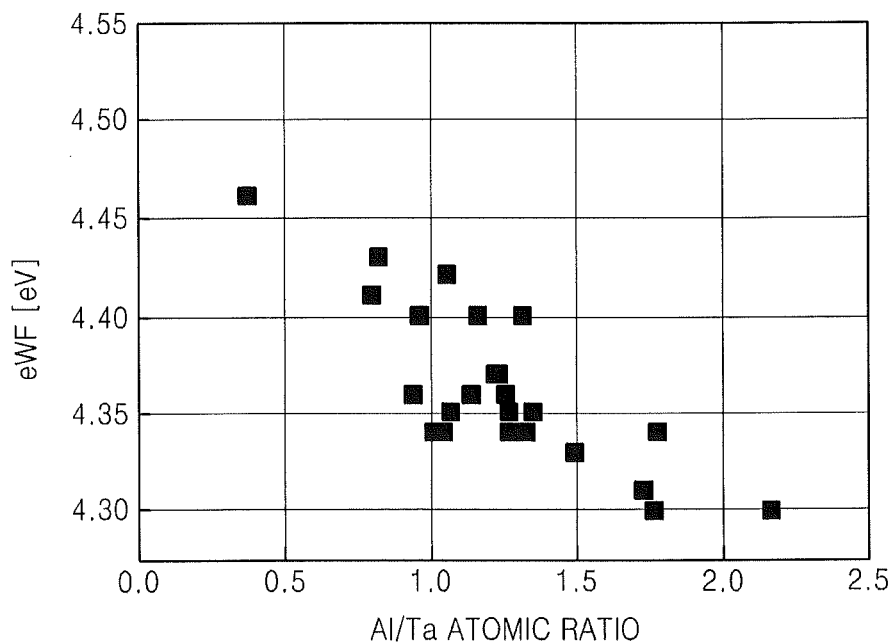
FIG. 23 is a graph showing work function properties of a semiconductor device according to an atomic ratio of Al/Ta of an Al doped metal-containing layer included in a gate line, according to an embodiment of the inventive concepts.

FIG. 23 is a graph showing work function properties of a semiconductor device according to an atomic ratio of Al/Ta of an Al doped metal-containing layer included in a gate line, according to an embodiment of the inventive concepts.

For the evaluation of FIG. 23, a plurality of NMOS transistors are formed by using a similar method to the method of forming the NMOS transistors used for the evaluation of FIG. 22. In order to control the atomic ratio of Al/Ta of the TaAlC layer in a gates line of each of the NMOS transistors, the number of times TEA is applied and a point of time when TEA is applied are controlled during an ALD process for forming the TaAlC layer.

From the result of FIG. 23, it is confirmed that a work function is reduced as the atomic ratio of Al/Ta of the TaAlC layer is increased.

Figure 24:
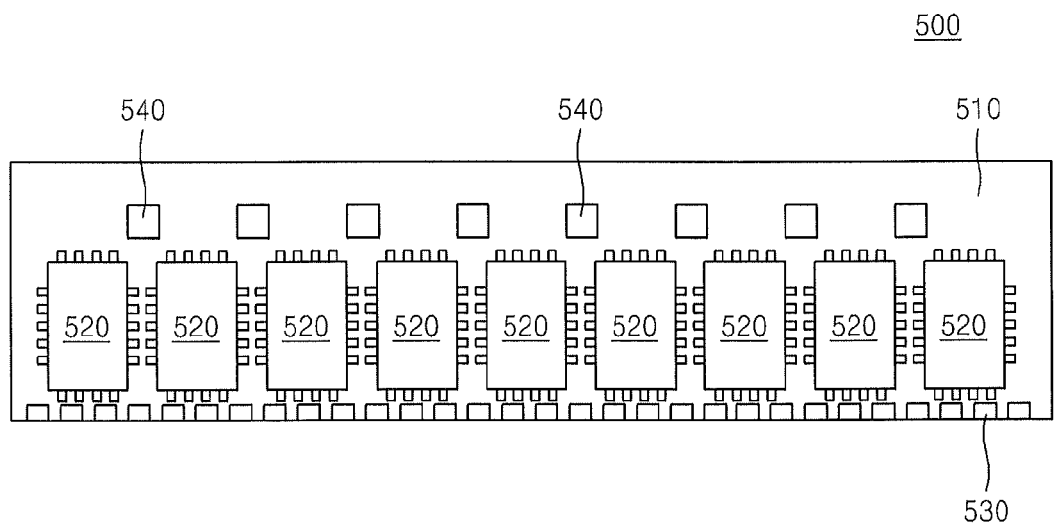
FIG. 24 is a plan view of a memory module, according to an embodiment of the inventive concepts.

FIG. 24 is a plan view of a memory module 500, according to an embodiment of the inventive concepts.

The memory module 500 includes a module substrate 510 and a plurality of semiconductor chips 520 attached to the module substrate 510.

The semiconductor chips 520 include a semiconductor device including a fin-type field effect transistor (FinFET) according to any of the embodiments described herein. For example, the semiconductor chips 520 may include the semiconductor devices 100, 200, 300, and 400 shown in FIGS. 1A through 6B.

Connecting portions 530 to be inserted into a socket of a mother board are disposed at one side of the module substrate 510. Ceramic decoupling capacitors 540 are disposed on the module substrate 510. The memory module 500 according to the present embodiment is not limited to the structure shown in FIG. 24 and may be formed in various ways.

Figure 25:
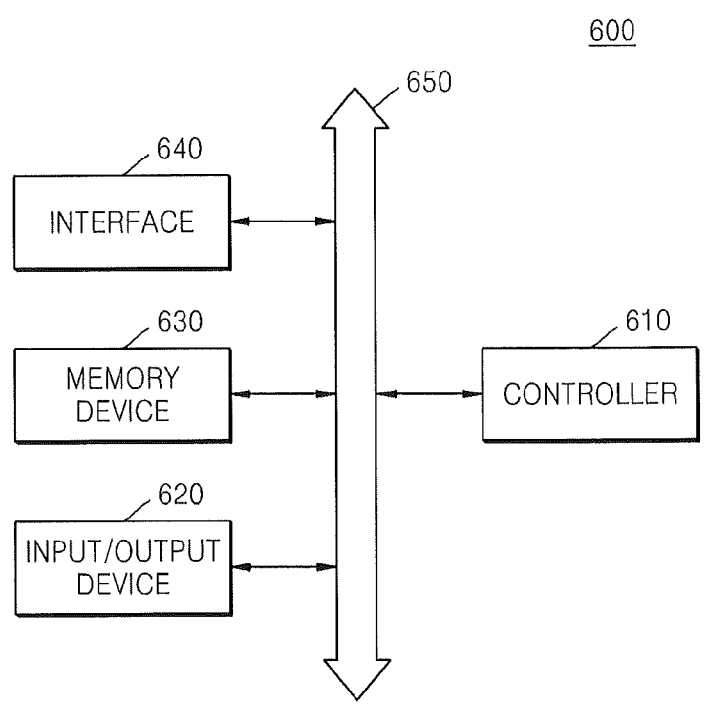
FIG. 25 is a block diagram of a system including a semiconductor device, according to an embodiment of the inventive concepts.

FIG. 25 is a block diagram of a system 600 including a semiconductor device, according to an embodiment of the inventive concepts.

The system 600 includes a controller 610, an input/output device 620, a memory device 630, and an interface 640. The system 600 may be a mobile system or a system that transmits and/or receives information. In some embodiments of the inventive concepts, the mobile system may be a personal digital assistant (PDA), a portable computer, a web tablet, a wireless phone, a mobile phone, a digital music player, or a memory card. The controller 610 controls an execution program of the system 600 and may include a microprocessor, a digital signal processor, a microcontroller, or a device similar thereto. The input/output device 620 may be used to input or output data of the system 600. The system 600 may be connected to an external device, for example, a personal computer (PC) or a network via the input/output device 620 and may exchange data with the external device. The input/output device 620 may be, for example, a keypad, a keyboard and/or a display device.

The memory device 630 may store a code and/or data for an operation of the controller 610 or may store data processed in the controller 610. The memory device 630, the input/output device 620, the interface 640 and/or the controller 610 may include a semiconductor device including a FinFET according to any of the embodiments described herein. For example, the memory device 630 may include the semiconductor devices 100, 200, 300, and 400 shown in FIGS. 1A through 6B.

The interface 640 may be a data transmission path between the system 600 and an external device. The controller 610, the input/output device 620, the memory device 630, and the interface 640 may communicate with each other via a bus 650. The system 600 may be used in a mobile phone, an MP3 player, a navigation device, a portable multimedia player (PMP), a solid state disk (SSD) and/or household appliances.

Figure 26:
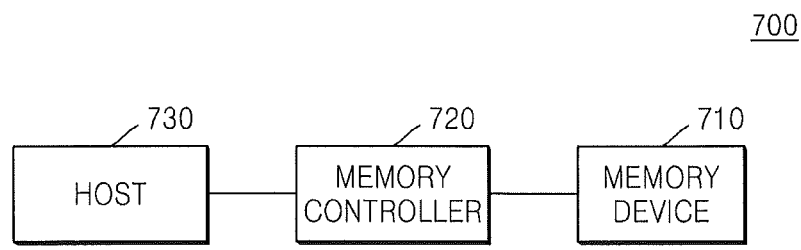
FIG. 26 is a block diagram of a memory card that is manufactured by a manufacturing method of a magnetic device according to an embodiment of the inventive concepts.

FIG. 26 is a block diagram of a memory card 700 that is manufactured by a manufacturing method of a magnetic device according to an embodiment of the inventive concepts.

The memory card 700 includes a memory device 710 and a memory controller 720.

The memory device 710 may store data. In some embodiments of the inventive concepts, the memory device 710 may have non-volatile properties whereby stored data may be retained when power is shut off. The memory device 710, the memory controller 720 and/or the host 730 may include a semiconductor device including a FinFET according to any of the embodiments described herein. For example, the memory device 710 may include the semiconductor devices 100, 200, 300, and 400 shown in FIGS. 1A through 6B.

The memory controller 720 may read data stored in the memory device 710 or may store the data of the memory device 710 in response to a read/write request of a host 730.

While the inventive concepts have been particularly shown and described with reference to various embodiments thereof, it will be understood that various changes in form and details may be made therein without departing from the spirit and scope of the following claims.

What is claimed is:

1. A semiconductor device comprising:
a first metal oxide semiconductor (MOS) transistor comprising a first fin-type active region having a first conductive channel region and a first gate line on the first fin-type active region, the first gate line comprising a first metal nitride-containing layer on an upper surface and opposite lateral surfaces of the first fin-type active region, and a first Al doped metal-containing layer on the first metal nitride-containing layer opposite the first fin-type active region; and
a second MOS transistor comprising a second fin-type active region having a second conductive channel region that is different conductivity type from the first conductive channel region and a second gate line on the second fin-type active region, the second gate line comprising a second metal nitride-containing layer on an upper surface and opposite lateral surfaces of the second fin-type active region and having a greater thickness than a thickness of the first metal nitride-containing layer, and a second Al doped metal-containing layer on the second metal nitride-containing layer opposite the second fin-type active region and having a same thickness as a thickness of the first Al doped metal-containing layer,
wherein the second metal nitride-containing layer comprises a first metal nitride-containing sub-layer on the upper surface and opposite lateral surfaces of the second fin-type active region, and a second metal nitride-containing sub-layer on the first metal nitride-containing sub-layer opposite the second fin-type active region, and
wherein each of the first metal nitride-containing sub-layer and the second metal nitride-containing sub-layer includes a Ti nitride layer including Ti and N, wherein the amount of N is greater than the amount of Ti.

2. The semiconductor device of claim 1, wherein the first Al doped metal-containing layer comprises Ta or Ti, and
wherein an atomic % of Al is greater than an atomic % of at least one first metal, in the first Al doped metal-containing layer.

3. The semiconductor device of claim 1, wherein an atomic % of nitrogen contained in the first metal nitride-containing sub-layer is equal to or greater than an atomic % of nitrogen contained in the second metal nitride-containing sub-layer.

4. The semiconductor device of claim 3,
wherein the first metal nitride-containing layer has same composition as that of the second metal nitride-containing sub-layer and has same thickness as that of the second metal nitride-containing sub-layer.

5. The semiconductor device of claim 1,
wherein the second Al doped metal-containing layer has same composition as that of the first Al doped metal-containing layer.

6. The semiconductor device of claim 1, wherein each of the first and second Al doped metal-containing layers comprises an $M_xAl_yC_z$ layer, wherein M is Ta or Ti, x, y, and z are each atomic %, $5 \leq x \leq 45$, $10 \leq y \leq 65$, $0 \leq z \leq 45$, and $x+y+z \leq 100$, and wherein $x<y$.

7. The semiconductor device of claim 1, wherein each of the first and second Al doped metal-containing layers comprises an $M_xAl_yC_z$ layer, wherein M is Ta or Ti, x, y, and z are each atomic %, $5 \leq x \leq 45$, $10 \leq y \leq 65$, $0 \leq z \leq 45$, and $x+y+z \leq 100$, and wherein $0.3<(y/x) \leq 10$.

8. The semiconductor device of claim 1, wherein each of the first and second metal nitride-containing layers comprises a nitride of titanium (Ti), tantalum (Ta), tungsten (W), ruthenium (Ru), niobium (Nb), molybdenum (Mo) and/or hafnium (Hf).

9. A semiconductor device comprising:
a N-type metal oxide semiconductor (MOS) transistor comprising a first fm-type active region, a first gate line including a first metal nitride-containing layer on an upper surface and Opposite lateral surfaces of the first fin-type active region, and a first Al doped metal-containing layer on the first metal nitride-containing layer opposite the first fin-type active region; and
a P-type MOS transistor comprising a second fin-type active region, a second gate line including a second metal nitride-containing layer on an upper surface and Opposite lateral surfaces of the second fin-type active region and having a greater thickness than a thickness of the first metal nitride-containing layer, and a second Al doped metal-containing layer on the second metal nitride-containing layer opposite the second fin-type active region and having a same thickness as a thickness of the first Al doped metal-containing layer.

10. The semiconductor device of claim 9, wherein the second metal nitride-containing layer has a greater thickness than a thickness of the first Al doped metal-containing layer.

11. The semiconductor device of claim 9, wherein the second metal nitride-containing layer comprises a first metal nitride-containing sub-layer on the upper surface and opposite lateral surfaces of the second fin-type active region, and a second metal nitride-containing sub-layer on the first metal nitride-containing sub-layer opposite the second fin-type active region.

12. The semiconductor device of claim 11, wherein a first metal nitride-containing sub-layer has a thickness greater than a thickness of the second metal nitride-containing sub-layer.

13. The semiconductor device of claim 9, wherein the first gate line further comprises a first a gap-fill metal layer extending on the first Al doped metal-containing layer remote from the first fin-type active region, and
wherein the second gate line further comprises a second a gap-fill metal layer extending on the second Al doped metal-containing layer remote from the second fin-type active region.

14. The semiconductor device of claim 13, wherein the first gate line further comprises a first capping layer interposed between the first Al doped metal-containing layer and the first gap-fill metal layer,
wherein the second gate line further comprises a second capping layer interposed between the second Al doped metal-containing layer and the second gap-fill metal layer, and
wherein the second capping layer is a same thickness as a thickness of the first capping layer.

15. The semiconductor device of claim 14, wherein each of the first and second capping layers comprises TiN, TaN, or a combination thereof.

16. The semiconductor device of claim 9, wherein each of the first and second Al doped metal-containing layers comprises an $M_xAl_yC_z$ layer, wherein M is Ta or Ti, x, y, and z are each atomic %, $5 \leq x \leq 45$, $10 \leq y \leq 65$, $0 \leq z \leq 45$, and $x+y+z \leq 100$, and wherein $x<y$.

17. The semiconductor device of claim 9, wherein each of the first and second Al doped metal-containing layers comprises an $M_xAl_yC_z$ layer, wherein M is Ta or Ti, x, y, and z are each atomic %, $5 \leq x \leq 45$, $10 \leq y \leq 65$, $0 \leq z \leq 45$, and $x+y+z \leq 100$, and wherein $0.3<(y/x) \leq 10$.

18. The semiconductor device of claim 9, wherein each of the first and second metal nitride-containing layers comprises a nitride of titanium (Ti), tantalum (Ta), tungsten (W), ruthenium (Ru), niobium (Nb), molybdenum (Mo) and/or hafnium (Hf).

19. The semiconductor device of claim 13, wherein the first gate line further comprises a first metal oxide layer interposed between the first Al doped metal-containing layer and the first gap-fill metal layer,
wherein the second gate line further comprises a second metal oxide layer interposed between the second Al doped metal-containing layer and the second gap-fill metal layer.

20. The semiconductor device of claim 19, wherein the metal oxide layer comprises a TaO layer, a TiO layer and/or an AlO layer.

* * * * *